US012302668B2

(12) United States Patent
Kim et al.

(10) Patent No.: US 12,302,668 B2
(45) Date of Patent: May 13, 2025

(54) DISPLAY DEVICE

(71) Applicant: Samsung Display Co., LTD., Yongin-si (KR)

(72) Inventors: Jun Yong Kim, Bucheon-si (KR); Sung Hoon Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 543 days.

(21) Appl. No.: 17/573,825

(22) Filed: Jan. 12, 2022

(65) Prior Publication Data

US 2022/0246802 A1 Aug. 4, 2022

(30) Foreign Application Priority Data

Feb. 3, 2021 (KR) .......................... 10-2021-0015201

(51) Int. Cl.
*H01L 33/20* (2010.01)
*H10H 20/831* (2025.01)
(Continued)

(52) U.S. Cl.
CPC .... *H10H 20/8312* (2025.01); *H10H 20/8514* (2025.01); *H10H 29/142* (2025.01)

(58) Field of Classification Search
CPC ......... H01L 33/20; H01L 33/50; H01L 33/38; H01L 33/62; H01L 33/382; H01L 33/504; H01L 33/505; H01L 33/507; H01L 27/12; H01L 27/15; H01L 27/156; H01L 27/1214; H01L 25/16; H01L 25/167; H01L 25/075; H01L 25/0753; H10H 30/01; H10H 30/0295; H10H 30/62; H10H 30/6215;
(Continued)

(56) References Cited

U.S. PATENT DOCUMENTS

2011/0102706 A1 5/2011 Oshio
2019/0198722 A1* 6/2019 Nakabayashi ...... H01L 25/0753
(Continued)

FOREIGN PATENT DOCUMENTS

JP 2010-80935 4/2010
KR 10-2019-0036107 4/2019
(Continued)

OTHER PUBLICATIONS

International Search Report corresponding to International Application No. PCT/KR2022/001360 dated May 9, 2022.
(Continued)

*Primary Examiner* — Chuong A Luu
(74) *Attorney, Agent, or Firm* — KILE PARK REED & HOUTTEMAN PLLC

(57) ABSTRACT

A display device includes a first electrode and a second electrode spaced apart from each other; first light emitting elements disposed between the first electrode and the second electrode and emitting first light; second light emitting elements disposed between the first electrode and the second electrode and emitting second light; and a wavelength conversion pattern disposed on the first light emitting elements and the second light emitting elements, wherein a peak wavelength of the first light is different from a peak wavelength of the second light, and the first light emitting elements and the second light emitting elements are disposed on a same layer.

20 Claims, 20 Drawing Sheets

(51) Int. Cl.
*H10H 20/851* (2025.01)
*H10H 29/14* (2025.01)

(58) Field of Classification Search
CPC ............. H10H 25/075; H10H 25/0753; H10H 20/812; H10H 20/814; H10H 20/831; H10H 20/851; H10H 20/8312; H10H 20/8514; H10H 29/14; H10H 29/142
USPC .......................................................... 257/79
See application file for complete search history.

(56) References Cited

U.S. PATENT DOCUMENTS

2020/0043976 A1 2/2020 Kim et al.
2020/0168668 A1 5/2020 Kim et al.
2021/0217739 A1 7/2021 Lee et al.
2021/0265419 A1 8/2021 Kim et al.

FOREIGN PATENT DOCUMENTS

| KR | 10-2020-0001649 | 1/2020 |
|---|---|---|
| KR | 10-2020-0016424 | 2/2020 |
| KR | 10-2020-0024378 | 3/2020 |
| KR | 10-2020-0027136 | 3/2020 |

OTHER PUBLICATIONS

Written Opinion corresponding to International Application No. PCT/KR2022/001360, dated May 9, 2022.

* cited by examiner

DISPLAY DEVICE

CROSS-REFERENCE TO RELATED APPLICATION(S)

This application claims priority to and the benefit of Korean Patent Application No. 10-2021-0015201 under 35 U.S.C. § 119, filed on Feb. 3, 2021, in the Korean Intellectual Property Office (KIPO), the entire contents of which are herein incorporated by reference.

BACKGROUND

1. Technical Field

The disclosure relates to a display device.

2. Description of Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a light emitting material and an inorganic light emitting diode using an inorganic material as a light emitting material.

SUMMARY

Aspects of the disclosure provide a display device with improved front surface luminance by disposing different types of light emitting elements that emit colors different from each other in a sub-pixel.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, there is provided a display device comprising a first electrode and a second electrode spaced apart from each other; first light emitting elements disposed between the first electrode and the second electrode, and emitting first light; second light emitting elements disposed between the first electrode and the second electrode, and emitting second light; and a wavelength conversion pattern disposed on the first light emitting elements and the second light emitting elements. A peak wavelength of the first light may be different from a peak wavelength of the second light, and the first light emitting elements and the second light emitting elements may be disposed on a same layer.

The wavelength conversion pattern may include a wavelength conversion material that converts the first light into third light, and a peak wavelength of the third light may be different from the peak wavelength of the first light.

The peak wavelength of the third light may be different from the peak wavelength of the second light, and the wavelength conversion material may convert the second light into the third light.

The peak wavelength of the third light and the peak wavelength of the second light may be included in a same range.

The peak wavelength of the first light may be shorter than the peak wavelength of the second light, and a number of the first light emitting elements may be greater than a number of the second light emitting elements.

The first light may have a peak wavelength in a range of about 445 nm to about 480 nm, and the second light may have a peak wavelength in a range of about 480 nm to about 780 nm.

The first light emitting elements and the second light emitting elements may be electrically connected in parallel to each other.

According to another embodiment of the disclosure, there is provided a display device comprising a first electrode and a second electrode spaced apart from each other; light emitting elements disposed between the first electrode and the second electrode; a first insulating layer disposed on the light emitting elements and exposing ends of each of the light emitting elements; and a wavelength conversion pattern disposed on the first insulating layer and the light emitting elements and including a wavelength conversion material. The light emitting elements may include first light emitting elements, each of the first light emitting element may emit first light, the first insulating layer may include lower wavelength conversion particles that convert the first light into second light, the wavelength conversion material may convert the first light into third light, and a peak wavelength of the first light may be different from a peak wavelength of the second light and a peak wavelength of the third light.

The peak wavelength of the second light may be different from the peak wavelength of the third light, and the wavelength conversion material may convert the second light into the third light.

The peak wavelength of the third light and the peak wavelength of the second light may be included in a same range.

The light emitting elements may include second light emitting elements, each of the second light emitting elements may emit fourth light, a peak wavelength of the fourth light may be different from the peak wavelength of the first light, and the first light emitting elements and the second light emitting elements are disposed on a same layer.

The peak wavelength of the fourth light and the peak wavelength of the second light are included in a same range, or the peak wavelength of the fourth light and the peak wavelength of the third light are included in a same range.

The peak wavelength of the first light may be shorter than the peak wavelength of the fourth light, and a number of the first light emitting elements may be greater than a number of the second light emitting elements.

According to still another embodiment of the disclosure, there is provided a display device including sub-pixels; a first electrode and a second electrode disposed in each of the sub-pixels and spaced apart from each other; light emitting elements disposed between the first electrode and the second electrode and disposed in each of the sub-pixels; and a color control layer disposed on the light emitting elements and disposed in each of the sub-pixels. The sub-pixels may include a first sub-pixel that emits light of a first color, the light emitting elements may include a first light emitting element disposed in the first sub-pixel, the first light emitting element may include a first main light emitting element including at least one first light emitting element that emits light of a second color, and a first sub-light emitting element including at least one second light emitting element that emits light of a third color, and the first main light emitting element and the first sub-light emitting element may be disposed on the same layer, and the second color may be different from the third color and the first color.

The light of the second color may have a peak wavelength in a range of about 445 nm to about 480 nm, and the light of the third color may have a peak wavelength in a range of about 480 nm to about 780 nm.

The at least one first light emitting element included in the first main light emitting element may include a plurality of first light emitting elements, the at least one second light emitting element included in the first sub-light emitting element may include a plurality of second light emitting elements, and a number of the at least one first light emitting element may be greater than a number of the at least one second light emitting element.

The first color may be different from the third color, and the color control layer may include a first wavelength conversion pattern disposed in the first sub-pixel and converting the second color light and the third color light into the first color light.

The sub-pixels may include a second sub-pixel that emits the third color light, the light emitting elements may include a second light emitting element disposed in the second sub-pixel, and the second light emitting element may include a second main light emitting element including the at least one first light emitting element, and a second sub-light emitting element including the at least one second light emitting element.

The first color and the third color may be a same color, and the color control layer may include a first wavelength conversion pattern disposed in the first sub-pixel and converting the second color light into the first color light.

The sub-pixels may include a second sub-pixel that emits light of a fourth color, the light emitting elements may include a second light emitting element disposed in the second sub-pixel, and the second light emitting element may include a second main light emitting element including the at least one first light emitting element; and a second sub-light emitting element including a third light emitting element that emits the light of the fourth color.

According to the display device according to one embodiment, one sub-pixel may include a first light emitting element that emits light of a first peak wavelength band, and a second of light emitting element that emits light of a second peak wavelength band different from light of the first peak wavelength band, so that the luminance of the front surface of the display device may be improved.

It should be noted that the effects of the disclosure are not limited to the one described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The same reference numbers indicate the same components throughout the specification.

It will be understood that the terms "contact," "connected to," and "coupled to" may include a physical and/or electrical contact, connection or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the drawings.

Figure 1:
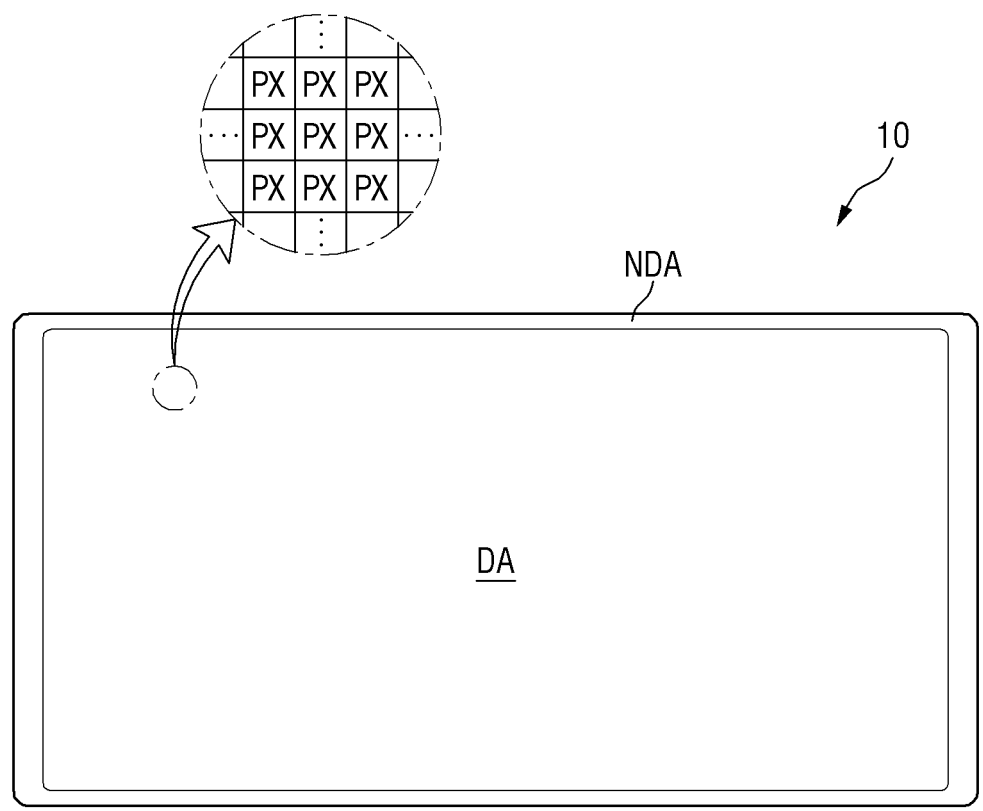
FIG. 1 is a schematic plan view of a display device according to an embodiment.

FIG. 1 is a schematic plan view of a display device according to an embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smartwatch, a watch phone, a head-mounted display, a mobile communication terminal, an electronic notebook, an electronic book, a portable multimedia player (PMP), a navigation device, a game machine, a digital camera, a camcorder, and the like, which provide a display screen.

The display device 10 includes a display panel which provides a display image. Examples of the display panel may include an inorganic light emitting diode display panel, an organic light emitting display panel, a quantum dot light emitting display panel, a plasma display panel, and a field emission display panel. In the following description, a case where an inorganic light emitting diode display panel is applied as a display panel will be discussed, but the disclosure is not limited thereto, and other display panels may be applied within the same scope of the technical spirit.

Hereinafter, a first direction DR1, a second direction DR2, and a third direction DR3 are defined in the drawings of an embodiment describing the display device 10. The first direction DR1 and the second direction DR2 may be perpendicular to each other in a plane. The third direction DR3 may be perpendicular to a plane defined by the first direction DR1 and the second direction DR2. The third direction DR3 is perpendicular to each of the first direction DR1 and the second direction DR2. In the embodiment describing the display device 10, the third direction DR3 indicates a thickness direction of the display device 10.

The display device 10 may have a rectangular shape including long and short sides such that the long sides in the first direction DR1 are longer than the short sides in the second direction DR2 in a plan view. A corner portion where the long side and the short side of the display device 10 meet may be right-angled in a plan view. However, the disclosure is not limited thereto, and it may be rounded to have a curved shape. The planar shape of the display device 10 is not limited to the illustrated example, and may be other shapes such as a square shape, a quadrilateral shape with rounded corners (vertices), other polygonal shapes, and a circular shape.

A display surface of the display device 10 may be disposed on a side of the display device 10 in the third direction DR3, which is the thickness direction. In embodiments describing the display device 10, unless otherwise noted, the term "upward" refers to a side in the third direction DR3, which is the display direction, and the term "top surface" refers to a surface toward the side of the third direction DR3. Further, the term "downward" refers to the other side in the third direction DR3, which is an opposite direction to the display direction, and the term "bottom surface" refers to a surface toward the other side in the third direction DR3. Furthermore, "left," "right," "upper," and "lower" indicate directions when the display device 10 is viewed from above. For example, "right side" indicates a side in the first direction DR1, "left side" indicates the other side in the first direction DR1, "upper side" indicates a side in the second direction DR2, and "lower side" indicates the other side in the second direction DR2.

The display device 10 may include a display area DA and a non-display area NDA. The display area DA is an area where an image may be displayed, and the non-display area NDA is an area where an image is not displayed.

The shape of the display area DA may follow the shape of the display device 10. For example, the shape of the display area DA may have a rectangular shape similar to the overall shape of the display device 10 in a plan view. The display area DA may substantially occupy the center of the display device 10.

The display area DA may include pixels PX. The pixels PX may be arranged in a matrix. The shape of each pixel PX may be a rectangular or square shape in a plan view. However, the shape of each pixel PX is not limited thereto and may be a rhombic shape in which each side is inclined with respect to a direction. The pixels PX may be alternately disposed in a stripe type or PENTILE® type.

The non-display area NDA may be disposed around the display area DA. The non-display area NDA may completely or partially surround the display area DA. In an embodiment, the display area DA may have a rectangular shape, and the non-display area NDA may be disposed adjacent to four sides of the display area DA. The non-display area NDA may form a bezel of the display device 10. In the non-display area NDA, wires, circuit drivers, or pad portions on which an external device is mounted may be disposed in the display device 10.

Figure 2:
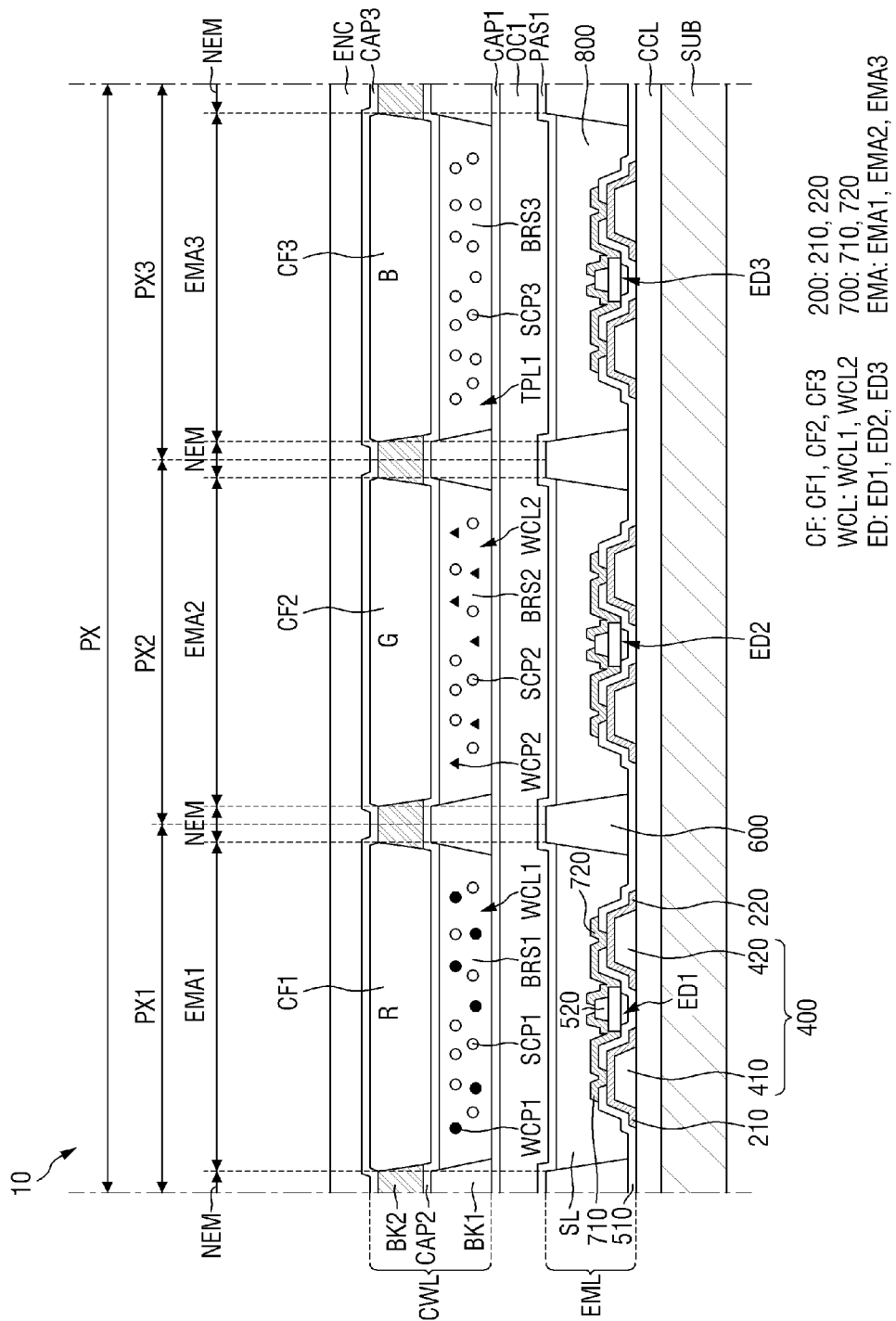
FIG. 2 is a schematic cross-sectional view of a display device according to an embodiment.

FIG. 2 is a schematic cross-sectional view of a display device according to an embodiment.

As described above, the display area DA of each display device 10 includes pixels PX arranged in rows and columns. The pixel PX represents a repeating unit for display. Referring to FIGS. 1 and 2, each pixel PX may include sub-pixels PXn (where n is a natural number of 1 to 3) emitting different colors to display full colors. For example, each pixel PX may include a first sub-pixel PX1 for emission of light of a first color, a second sub-pixel PX2 for emission of light of a second color, and a third sub-pixel PX3 for emission of light of a third color. For example, the first color may be red, the second color may be green, and the third color may be blue. On the other hand, although the drawing illustrates that a pixel PX includes three sub-pixels PXn, the disclosure is not limited thereto. For example, a pixel PX may include a larger number of sub-pixels PXn.

Each of the sub-pixels PXn may include an emission area EMA and a light blocking area NEM at the periphery thereof. Specifically, the first sub-pixel PX1 may include a first emission area EMA1, the second sub-pixel PX2 may include a second emission area EMA2, and the third sub-pixel PX3 may include a third emission area EMA3.

The first to third emission areas EMA1, EMA2, and EMA3 may be areas through which light emitted from a light emitting element layer EML of the display device 10 to be described below is provided to the outside, and the light blocking area NEM may be an area through which the light emitted from the light emitting element layer EML does not pass. The first emission area EMA1 may emit light of the first color, the second emission area EMA2 may emit light of the second color, and the third emission area EMA3 may emit light of the third color. For example, the first color may be red, the second color may be green, and the third color may be blue.

The light blocking area NEM may be disposed to surround the first emission area EMA1, the second emission area EMA2, and the third emission area EMA3. The first emission area EMA1, the second emission area EMA2, and the third emission area EMA3 may be divided by the light blocking area NEM.

Referring to FIG. 2, the display device 10 may include a substrate SUB, a circuit element layer CCL disposed on the substrate SUB, the light emitting element layer EML disposed on the circuit element layer CCL, and a color control layer CWL disposed on the light emitting element layer EML. The display device 10 may further include an encapsulation layer ENC disposed on the color control layer CWL.

The substrate SUB may be an insulating substrate. The substrate SUB may be made of (or include) an insulating material such as glass, quartz, or polymer resin. Further, the substrate SUB may be a rigid substrate, but may also be a flexible substrate which can be bent, folded or rolled.

The circuit element layer CCL may be disposed on a surface of the substrate SUB. The circuit element layer CCL may include at least one transistor to drive the light emitting element layer EML.

The light emitting element layer EML may be disposed on a surface of the circuit element layer CCL. The light emitting element layer EML may include a first bank 400, a second bank 600, an electrode layer 200, a contact electrode 700, a light emitting element ED, insulating layers 510 and 520, and a filling layer 800.

The first bank 400 may be disposed on the circuit element layer CCL. The first bank 400 may be disposed in each of the first to third emission areas EMA1, EMA2, and EMA3 that are emission areas of the first to third sub-pixels PX1, PX2, and PX3, respectively. The first bank 400 disposed in each of the first to third emission areas EMA1, EMA2, and EMA3 may include sub-banks, and the sub-banks may be disposed to be spaced apart from each other. For example, the first bank 400 may include a first sub-bank 410 and a second sub-bank 420 that are spaced apart from each other.

The electrode layer 200 may be disposed on the first bank 400. The electrode layer 200 may include electrodes spaced apart from each other. For example, the electrode layer 200 may include a first electrode 210 and a second electrode 220. The first electrode 210 may be disposed on the first sub-bank 410, and the second electrode 220 may be disposed on the second sub-bank 420.

The first insulating layer 510 may be disposed on the electrode layer 200. The first insulating layer 510 may expose at least a part of the first electrode 210 and the second electrode 220 on the electrode layer 200.

The second bank 600 may be disposed on the first insulating layer 510 and may include an opening exposing the first bank 400 and light emitting elements ED to be described below. The second bank 600 may be disposed in the light blocking area NEM. The second bank 600 may be disposed at the boundary between the first to third sub-pixels PX1, PX2, and PX3.

The light emitting elements ED may be disposed on the first insulating layer 510 between the first sub-bank 410 and the second sub-bank 420. The light emitting element ED may be disposed on the first insulating layer 510 between the first electrode 210 and the second electrode 220 so that both ends thereof are placed on the first electrode 210 and the second electrode 220, respectively.

The light emitting elements ED may be disposed in the emission area of each sub-pixel. The light emitting elements ED may include a first light emitting element ED1, a second light emitting element ED2, and a third light emitting element ED3. The first light emitting element ED1 may be disposed in the first emission area EMA1 of the first sub-pixel PX1, the second light emitting element ED2 may be disposed in the second emission area EMA2 of the second sub-pixel PX2, and the third light emitting element ED3 may be disposed in the third emission area EMA3 of the third sub-pixel PX3.

The second insulating layer 520 may be partially disposed on the light emitting element ED disposed between the first sub-bank 410 and the second sub-bank 420. The second insulating layer 520 may be disposed to partially surround the outer surface of the light emitting element ED. The second insulating layer 520 may be disposed on the light emitting element ED to expose both ends of the light emitting element ED. The second insulating layer 520 may protect the light emitting element ED and may also affix the light emitting element ED so that the light emitting element ED is not separated during the manufacturing process of the display device 10.

The contact electrode 700 may be disposed on the second insulating layer 520. The contact electrode 700 may contact each of a part of the electrode layer 200 exposed by the first insulating layer 510 and a part of the light emitting element ED. For example, the contact electrode 700 may contact each of the electrode layer 200 and the light emitting element ED to electrically connect them.

The contact electrode 700 may include a first contact electrode 710 and a second contact electrode 720 spaced apart from the first contact electrode 710. The first contact electrode 710 and the second contact electrode 720 may be electrically insulated from each other.

The first contact electrode 710 may be disposed on the first electrode 210, and the second contact electrode 720 may be disposed on the second electrode 220. The first contact electrode 710 may contact each of the first electrode 210 exposed by the first insulating layer 510 and one end (or a first end) of the light emitting element ED exposed by the second insulating layer 520. The second contact electrode 720 may contact each of the second electrode 220 exposed by the first insulating layer 510 and the other end (or a second end) of the light emitting element ED exposed by the second insulating layer 520. The first end of the light emitting element ED exposed by the second insulating layer 520 may be electrically connected to the first electrode 210 through the first contact electrode 710, and the second end of the light emitting element ED exposed by the second insulating layer 520 may be electrically connected to the second electrode 220 through the second contact electrode 720.

The filling layer 800 may be disposed to fill the area partitioned by the second bank 600, and the filling layer 800 may planarize a step formed by the first bank 400 and the light emitting elements ED. For example, the filling layer 800 may include an organic insulating material, for example, an organic material such as polyimide (PI). The filling layer 800 may be omitted.

The display device 10 may further include a first passivation layer PAS1, a first planarization layer OC1, and a first capping layer CAP1.

The first passivation layer PAS1 may be disposed on the light emitting element layer EML. The first passivation layer PAS1 may protect the light emitting element layer EML. The first passivation layer PAS1 may prevent infiltration of impurities such as moisture or air from the outside, thereby preventing damage to the light emitting elements ED.

The first planarization layer OC1 may be disposed on the light emitting element layer EML. The first planarization layer OC1 may be disposed on the light emitting element layer EML, and may planarize a step (or height difference) above the light emitting element layer EML. The first planarization layer OC1 may include an organic material. For example, the first planarization layer OC1 may include at least one of acrylic resin, epoxy resin, phenolic resin, polyamide resin, or polyimide resin.

The first capping layer CAP1 may be disposed on the first planarization layer OC1. The first capping layer CAP1 may seal the top surface of the light emitting element layer EML. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The color control layer CWL may be disposed on the first capping layer CAP1. The color control layer CWL may be disposed on the light emitting element layer EML. The color control layer CWL may be disposed on the light emitting element layer EML to transmit light emitted from the light emitting element layer EML and incident on the color control layer CWL while converting or maintaining the wavelength of the light. The color control layer CWL may selectively transmit light of a specific wavelength band according to the wavelength band of the incident light and may block or absorb light other than the specific wavelength band. On the other hand, the drawing illustrates that the color control layer CWL is disposed on the first planarization layer OC1, but the disclosure is not limited thereto. For example, the first planarization layer OC1 may be omitted, and the color control layer CWL may be directly disposed on the light emitting element layer EML.

The color control layer CWL may include wavelength control layers WCL and TPL1, a first light blocking member BK1, a second capping layer CAP2, a color filter layer CF, a second light blocking member BK2, and a third capping layer CAP3.

The first light blocking member BK1 may be disposed on the first capping layer CAP1. The first light blocking member BK1 may be disposed in the light blocking area NEM. The first light blocking member BK1 may overlap the second bank 600 in the thickness direction of the display device 10 (e.g., the third direction DR3). The first light blocking member BK1 may block transmission of light. The first light blocking member BK1 may prevent light infiltration and color mixture between the first to third emission areas EMA1, EMA2, and EMA3, which leads to the improvement of color reproducibility. The first light blocking member BK1 may be formed in a grid shape surrounding the first to third emission areas EMA1, EMA2, and EMA3 in a plan view.

The first light blocking member BK1 may include an organic light blocking material and a lyophobic component. Here, the lyophobic component may be formed of fluorine-containing monomer or fluorine-containing polymer and, in detail, may include fluorine-containing aliphatic polycarbonate. For example, the first light blocking member BK1 may be made of a black organic material including the lyophobic component, but is not limited thereto.

The wavelength control layers WCL and TPL1 may be disposed on the first capping layer CAP1 exposed by the first light blocking member BK1. The wavelength control layers WCL and TPL1 may include a wavelength conversion layer WCL that converts the wavelength of light incident on the wavelength control layers WCL and TPL1, and a light transmission pattern TPL1 that transmits light incident on the wavelength control layers WCL and TPL1 while maintaining the wavelength thereof.

The wavelength conversion layer WCL or the light transmission pattern TPL1 may be disposed to be separated for each of the first to third sub-pixels PX1, PX2, and PX3. The wavelength conversion layer WCL or the light transmission pattern TPL1 may be disposed in each emission area of the first to third sub-pixels PX1, PX2, and PX3, for example, each of the first to third emission areas EMA1, EMA2, and EMA3, and the wavelength conversion layers WCL and/or the light transmission patterns TPL1 disposed adjacent to each other may be spaced apart from each other by the first light blocking member BK1 disposed in the light blocking area NEM.

The wavelength conversion layer WCL may be disposed in the sub-pixel that needs to convert the wavelength of light incident from the light emitting element layer EML because the light incident from the light emitting element layer EML has light that exhibits a color different from that of the corresponding sub-pixel. The light transmission pattern TPL1 may be disposed in the sub-pixel in which light incident from the light emitting element layer EML exhibits the same color as the color of the corresponding sub-pixel. In the illustrated embodiment, the wavelength conversion layer WCL may be disposed in each of the first sub-pixel PX1 and the second sub-pixel PX2, and the light transmission pattern TPL1 may be disposed in the third sub-pixel PX3.

The wavelength conversion layer WCL may include a first wavelength conversion pattern WCL1 disposed on the first sub-pixel PX1 and a second wavelength conversion pattern WCL2 disposed on the second sub-pixel PX2.

The first wavelength conversion pattern WCL1 may be disposed in the first emission area EMA1 partitioned by the first light blocking member BK1 in the first sub-pixel PX1. The first wavelength conversion pattern WCL1 may convert light incident from the light emitting element layer EML into first color light and then emit the light. Specifically, the first wavelength conversion pattern WCL1 may convert light incident from the light emitting element layer EML into red light and then emit the light.

The first wavelength conversion pattern WCL1 may include a first base resin BRS1 and a first wavelength conversion material WCP1 dispersed in the first base resin BRS1. The first wavelength conversion pattern WCL1 may further include a first scatterer SCP1 dispersed in the first base resin BRS1.

The second wavelength conversion pattern WCL2 may be disposed in the second emission area EMA2 partitioned by the first light blocking member BK1 in the second sub-pixel PX2. The second wavelength conversion pattern WCL2 may convert light, incident from the light emitting element layer EML, into second color light and then emit the light. Specifically, the second wavelength conversion pattern WCL2 may convert light incident from the light emitting element layer EML into green light and then emit the light.

The second wavelength conversion pattern WCL2 may include a second base resin BRS2 and a second wavelength conversion material WCP2 dispersed in the second base resin BRS2. The second wavelength conversion pattern WCL2 may further include a second scatterer SCP2 dispersed in the second base resin BRS2.

The light transmission pattern TPL1 may be disposed in the third emission area EMA3 partitioned by the first light blocking member BK1 in the third sub-pixel PX3. The light transmission pattern TPL1 may maintain the wavelength of light incident from the light emitting element layer EML and allow the light to emit. Specifically, the light transmission pattern TPL1 may maintain light incident from the light emitting element layer EML as blue light and then emit the light.

The light transmission pattern TPL1 may include a third base resin BRS3. The light transmission pattern TPL1 may further include a third scatterer SCP3 dispersed in the third base resin BRS3.

The first to third base resins BRS1, BRS2, and BRS3 may include a light transmitting organic material. For example, the first to third base resins BRS1, BRS2, and BRS3 may include epoxy resin, acrylic resin, cardo resin, imide resin, or the like. The first to third base resins BRS1, BRS2 and BRS3 may be formed of the same material, but the disclosure is not limited thereto.

The first to third scatterers SCP1, SCP2 and SCP3 may have a refractive index different from that of the first to third base resins BRS1, BRS2, and BRS3. The first to third scatterers SCP1, SCP2, and SCP3 may include metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like. The first to third scatterers SCP1, SCP2, and SCP3 may be formed of the same material, but the disclosure is not limited thereto.

The first wavelength conversion material WCP1 may be a material that converts the third color light or the second color light into the first color light, and the second wavelength conversion material WCP2 may be a material that converts the third color light into the second color light. For example, the first wavelength conversion material WCP1 may be a material that converts blue light into red light or green light into red light. The second wavelength conversion material WCP2 may be a material that converts blue light into green light. The first wavelength conversion material WCP1 and the second wavelength conversion material WCP2 may be quantum dots, quantum bars, phosphors or the like. Examples of the quantum dot may include group IV nanocrystal, group II-VI compound nanocrystal, group III-V compound nanocrystal, group IV-VI nanocrystal, and a combination thereof.

The second capping layer CAP2 may be disposed on the wavelength control layers WCL and TPL1 and the first light blocking member BK1 to cover them. For example, the second capping layer CAP2 may seal the first wavelength conversion pattern WCL1, the second wavelength conversion pattern WCL2, the light transmission pattern TPL1, and the first light blocking member BK1 to prevent damage to or contamination of the first wavelength conversion pattern WCL1, the second wavelength conversion pattern WCL2, and the light transmission pattern TPL1. The second capping layer CAP2 may be made of an inorganic material. The second capping layer CAP2 and the first capping layer CAP1 may be made of the same material, or the second capping layer CAP2 may be made of the material that may form the first capping layer CAP1.

The second light blocking member BK2 may be disposed on the second capping layer CAP2. The second light blocking member BK2 may be disposed in the light blocking area NEM along the boundary of the first to third sub-pixels PX1, PX2, and PX3 on the second capping layer CAP2. The second light blocking member BK2 may overlap the first light blocking member BK1 and/or the second bank 600 in the thickness direction (e.g., the third direction DR3) of the display device 10.

The second light blocking member BK2 may not only block light emission, but also suppress reflection of external light. The second light blocking member BK2 may be formed in a grid shape surrounding the first to third emission areas EMA1, EMA2, and EMA3 in a plan view.

The second light blocking member BK2 may include an organic material. In an embodiment, the second light blocking member BK2 may include a light absorbing material that absorbs a visible wavelength band. The second light blocking member BK2 includes a light absorbing material and is disposed along the boundary of the first to third sub-pixels PX1, PX2, and PX3, so that the second light blocking member BK2 may define the first to third emission areas EMA1, EMA2, and EMA3.

The color filter layer CF may be disposed on the second capping layer CAP2 in the display area DA. The color filter layer CF may be disposed on a surface of the second capping layer CAP2 in an area partitioned by the second light blocking member BK2.

The color filter layer CF may include a first color filter CF1, a second color filter CF2, and a third color filter CF3.

The first color filter CF1 may be disposed in the first emission area EMA1 of the first sub-pixel PX1, the second color filter CF2 may be disposed in the second emission area EMA2 of the second sub-pixel PX2, and the third color filter CF3 may be disposed in the third emission area EMA3 of the third sub-pixel PX3. The first to third color filters CF1, CF2, and CF3 may be surrounded by the second light blocking member BK2.

The first to third color filters CF1, CF2, and CF3 may include a colorant such as a dye or pigment that absorbs a wavelength other than a corresponding color wavelength. The first color filter CF1 may selectively allow the first color light (e.g., red light) to pass therethrough and may block or absorb the second color light (e.g., green light) and the third color light (e.g., blue light). The second color filter CF2 may selectively allow the second color light (e.g., green light) to pass therethrough and may block or absorb the first color light (e.g., red light) and the third color light (e.g., blue light). The third color filter CF3 may selectively allow the third color light (e.g., blue light) to pass therethrough and may block or absorb the first color light (e.g., red light) and the second color light (e.g., green light). For example, the first color filter CF1 may be a red color filter, the second color filter CF2 may be a green color filter, and the third color filter CF3 may be a blue color filter.

The first to third color filters CF1, CF2, and CF3 may absorb a part of the light coming from the outside of the display device 10 to reduce the reflected light of the external light. This means that the first to third color filters CF1, CF2, and CF3 can prevent color distortion caused by the reflection of the external light.

The color filter layer CF is disposed on the first and second wavelength conversion patterns WCL1 and WCL2 and the light transmission pattern TPL1, so that the display device 10 may not require a separate substrate for the color filter layer CF. Therefore, the thickness of the display device 10 may be relatively reduced.

The third capping layer CAP3 may be disposed on the color filter layer CF and the second light blocking member BK2 to cover them. The third capping layer CAP3 may protect the color filter layer CF.

The first encapsulation layer ENC may be disposed on the color control layer CWL. The first encapsulation layer ENC may prevent oxygen or moisture from penetrating into the color control layer CWL and the light emitting element layer EML that are disposed therebelow. To this end, the first encapsulation layer ENC may include at least one inorganic layer. The first encapsulation layer ENC may be disposed to cover the color control layer CWL, the light emitting element layer EML, and the circuit element layer CCL that are disposed therebelow.

Figure 3:
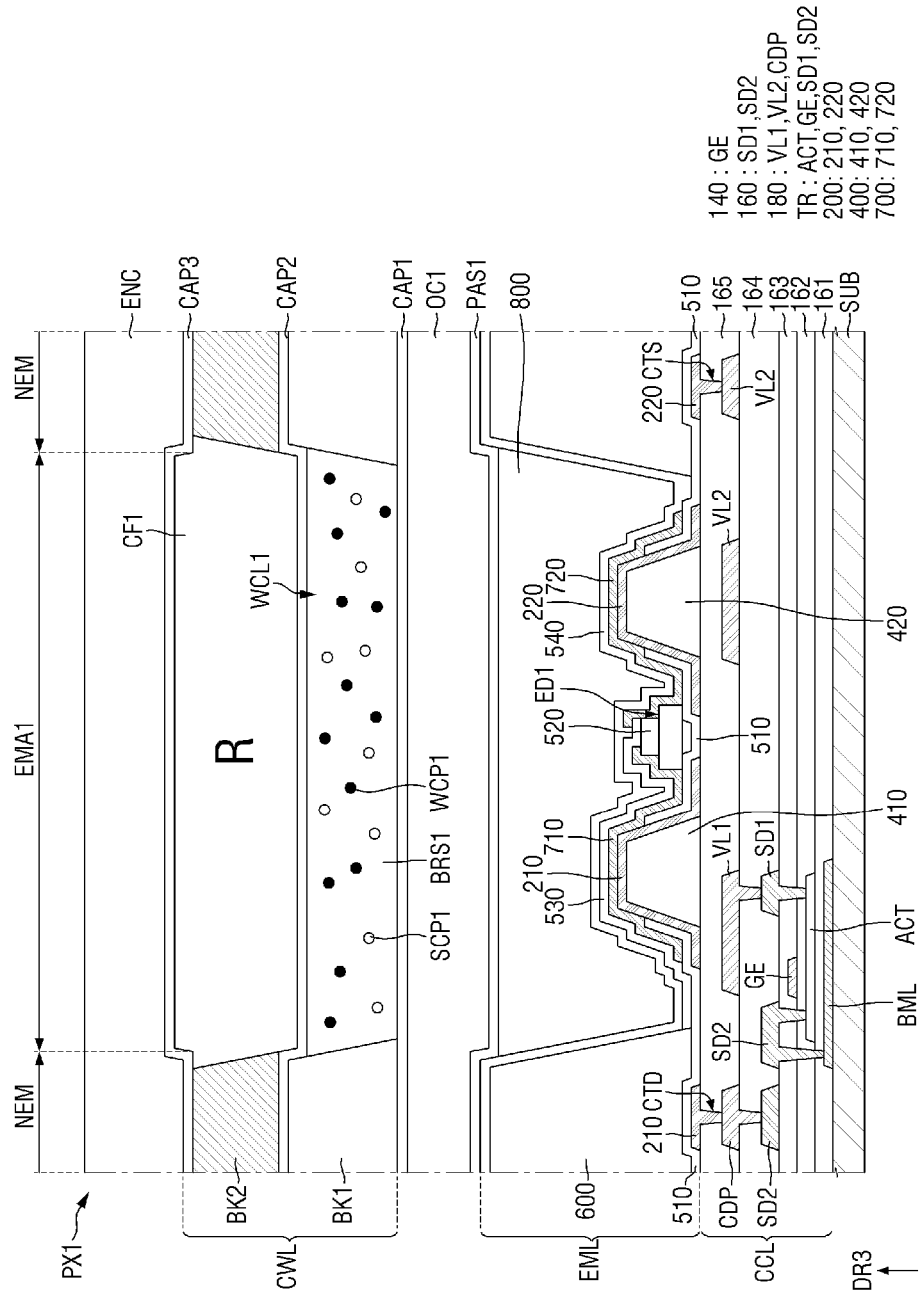
FIG. 3 is a schematic cross-sectional view of a first sub-pixel according to an embodiment.

FIG. 3 is a schematic cross-sectional view of a first sub-pixel according to an embodiment.

Hereinafter, a structure of the circuit element layer CCL disposed on the substrate SUB will be described with reference to FIG. 3. On the other hand, in FIG. 3, only the cross-sectional structure of the first sub-pixel PX1 including the first light emitting element ED1 is illustrated. Hereinafter, in describing the cross-sectional structure of the circuit element layer CCL, the cross-sectional structure of the circuit element layer CCL of the second sub-pixel PX2 including the second light emitting element ED2 and the third sub-pixel PX3 including the third light emitting element ED3 is similar to the cross-sectional structure of the circuit element layer CCL of the first sub-pixel PX1, so that a description of the cross-sectional structure of the circuit element layer CCL of the first sub-pixel PX1 will replace a description of the cross-sectional structure of the circuit element layer CCL of the second and third sub-pixels PX2 and PX3.

The circuit element layer CCL may include a lower metal layer BML, a buffer layer 161, first to third conductive layers 140, 160, and 180, a semiconductor layer and a gate insulating layer 162, an interlayer insulating layer 163, a passivation layer 164, and a via layer 165.

The lower metal layer BML may be disposed on the substrate SUB. The lower metal layer BML may be a light blocking layer that protects an active material layer (or active layer) ACT of a transistor TR from external light. The lower metal layer BML may include a material for blocking light. For example, the lower metal layer BML may be formed of an opaque metal material that blocks transmission of light.

The lower metal layer BML, has a patterned shape. The lower metal layer BML may be disposed to cover (or overlap) at least the channel region of an active layer ACT of the transistor TR from the bottom, and may be further disposed to cover the entire active layer ACT of the transistor TR from the bottom. However, the disclosure is not limited thereto, and the lower metal layer BML may be omitted.

The buffer layer 161 may be disposed on the lower metal layer BML. The buffer layer 161 may be disposed to cover the entire surface of the substrate SUB where the lower metal layer BML is disposed. The buffer layer 161 may protect the transistor TR from moisture permeating through the substrate SUB that is susceptible to moisture permeation. The buffer layer 161 may be formed of (or include) inorganic layers that are alternately stacked. For example, the buffer layer 161 may be formed of a multilayer in which inorganic layers including at least one of silicon oxide ($SiO_x$), silicon nitride ($SiN_x$), and silicon oxynitride ($SiO_xN_y$) are alternately stacked.

The semiconductor layer may be disposed on the buffer layer 161. The semiconductor layer may include the active layer ACT of the transistor TR. The active layer ACT may be disposed to overlap the lower metal layer BML.

Although only a transistor TR of the transistors included in the first sub-pixel PX1 of the display device 10 is shown in the drawing, the disclosure is not limited thereto. For example, the first sub-pixel PX1 of the display device 10 may include one or more transistors. For example, the first sub-pixel PX1 of the display device 10 may include two or three transistors.

The semiconductor layer may include polycrystalline silicon, monocrystalline silicon, oxide semiconductor, and the like. In an embodiment, in case that the semiconductor layer contains polycrystalline silicon, the polycrystalline silicon may be formed by crystallizing amorphous silicon. In case that the semiconductor layer contains polycrystalline silicon, the active layer ACT may include doping regions doped with impurities and channel regions disposed therebetween. In another embodiment, the semiconductor layer may include an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) or the like.

A gate insulating layer 162 may be disposed on the semiconductor layer. The gate insulating layer 162 may function as a gate insulating layer of the transistor TR. The gate insulating layer 162 may be formed of an inorganic layer including an inorganic material such as silicon oxide ($SiO_x$), silicon nitride ($SiN_x$), or silicon oxynitride ($SiO_xN_y$), or a stacked structure thereof.

The first conductive layer 140 may be disposed on the gate insulating layer 162. The first conductive layer 140 may include a gate electrode GE of the transistor TR. The gate electrode GE may be disposed to overlap the channel region of the active layer ACT in the third direction DR3.

The first conductive layer 140 may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

The interlayer insulating layer 163 may be disposed on the first conductive layer 140. The interlayer insulating layer 163 may be disposed to cover the first conductive layer 140 to function as an insulating layer between the first conductive layer 140 and other layers disposed thereon. The interlayer insulating layer 163 may be formed as a multilayer in which inorganic layers including an inorganic insulating material, for example, at least one of silicon oxide (SiO$_x$), silicon nitride (SiN$_x$), and silicon oxynitride (SiO$_x$N$_y$), are alternately stacked.

The second conductive layer 160 is disposed on the interlayer insulating layer 163. The second conductive layer 160 may include a drain electrode SD1 and a source electrode SD2 of the transistor TR.

The drain electrode SD1 and the source electrode SD2 of the transistor TR may be electrically connected to both ends (e.g., each doping region of the active layer ACT of the transistor TR) of the active layer ACT of the transistor TR, respectively, through contact holes penetrating the interlayer insulating layer 163 and the gate insulating layer 162. The source electrode SD2 of the transistor TR may be electrically connected to the lower metal layer BML through another contact hole penetrating the interlayer insulating layer 163, the gate insulating layer 162, and the buffer layer 161.

The second conductive layer 160 may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

The passivation layer 164 is disposed on the second conductive layer 160. The passivation layer 164 serves to cover and protect the second conductive layer 160. The passivation layer 164 may be formed as a multilayer in which inorganic layers including an inorganic insulating material, for example, at least one of silicon oxide (SiO$_x$), silicon nitride (SiN$_x$), and silicon oxynitride (SiO$_x$N$_y$) are alternately stacked.

A third conductive layer 180 is disposed on the passivation layer 164. The third conductive layer 180 may include a first voltage line VL1, a second voltage line VL2, and a first conductive pattern CDP.

A high potential voltage (or first power voltage) supplied to the transistor TR may be applied to the first voltage line VL1, and a low potential voltage (or second power voltage) lower than the high potential voltage (or first power voltage) supplied to the first voltage line VL1 may be applied to the second voltage line VL2.

The first voltage line VL1 may be electrically connected to the transistor TR to supply a high potential voltage (or first power voltage) to the transistor TR. Specifically, the first voltage line VL1 may be electrically connected to the drain electrode SD1 of the transistor TR through a contact hole penetrating the passivation layer 164.

The second voltage line VL2 may be electrically connected to the second electrode 220 to supply a low potential voltage (or second power voltage) to the second electrode 220. During the manufacturing process of the display device 10, the second voltage line VL2 may be applied with an alignment signal required to align the light emitting elements ED.

The first conductive pattern CDP may be electrically connected to the source electrode SD2 of the transistor TR through a contact hole penetrating the passivation layer 164. The first conductive pattern CDP may be electrically connected to the first electrode 210. The first conductive pattern CDP may transmit a first power voltage, applied from the first voltage line VL1, to the first electrode 210.

The third conductive layer 180 may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

The via layer 165 is disposed on the third conductive layer 180. The via layer 165 may be disposed on the passivation layer 164 on which the third conductive layer 180 is disposed. The via layer 165 may planarize the surface. The via layer 165 may include an organic insulating material, for example, an organic material such as polyimide (PI).

Figure 4:
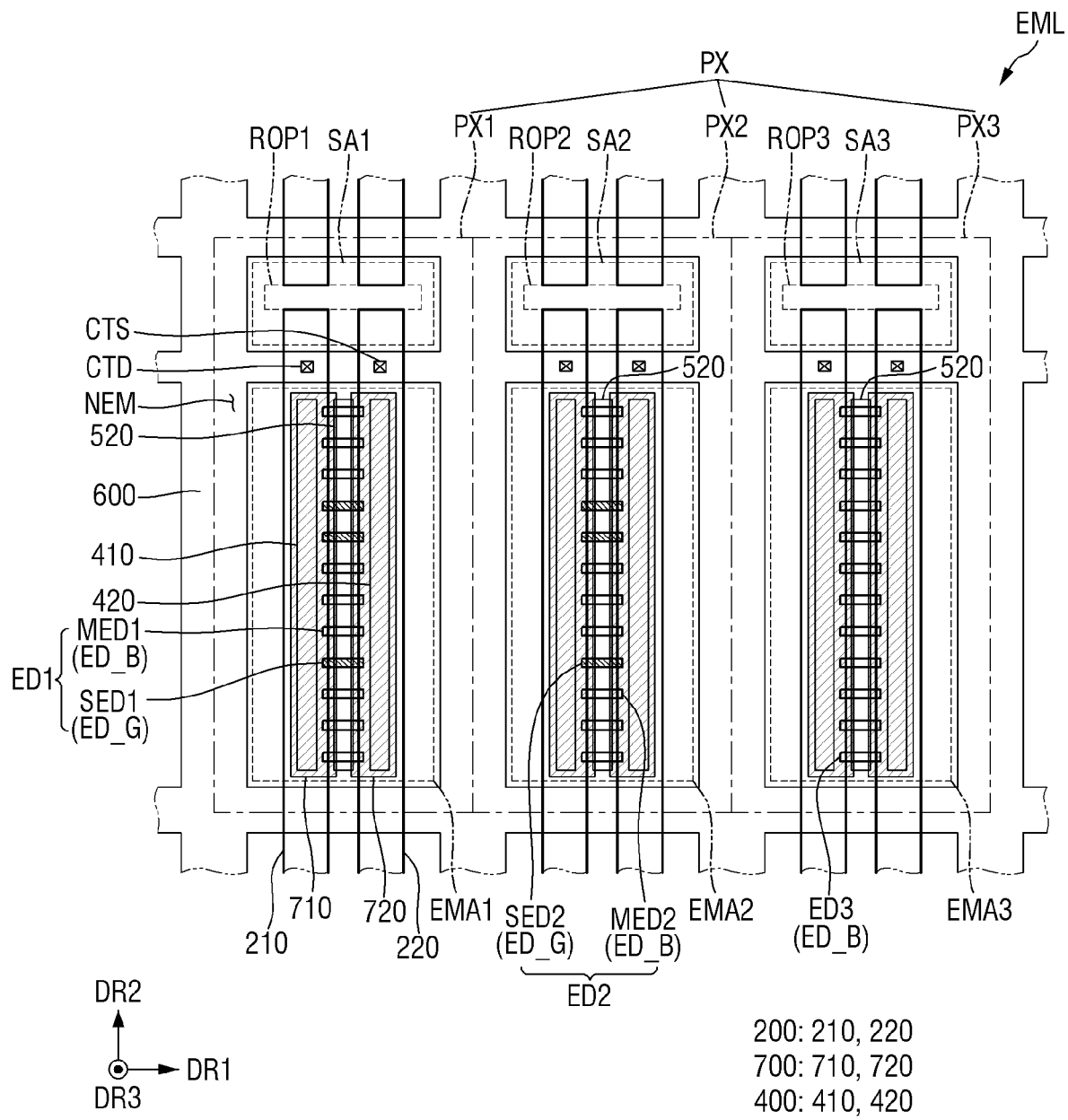
FIG. 4 is a schematic plan layout view of a light emitting element layer according to an embodiment.

FIG. 4 is a schematic plan layout view of a light emitting element layer according to an embodiment.

Hereinafter, a structure of the light emitting element layer EML disposed on the via layer 165 will be described in detail with reference to FIGS. 3 and 4.

On the other hand, the structure of the light emitting element layer EML of the first to third sub-pixels PX1, PX2, and PX3 differs only in the type of the light emitting element ED included in each sub-pixel PXn, and the disposition of other members and a relative disposition relationship between the light emitting element ED and the other members may be substantially the same. Accordingly, in describing the structure of the light emitting element layer EML of the second and third sub-pixels PX2 and PX3, a description of the structure of the light emitting element layer EML of the first sub-pixel PX1 will be substituted for a configuration that is the same as the structure of the light emitting element layer EML of the first sub-pixel PX1, and a description will be made focusing on a configuration different from the structure of the light emitting element layer EML of the first sub-pixel PX1.

The first sub-pixel PX1 of the light emitting element layer EML may include the first emission area EMA1 and the light blocking area NEM, the second sub-pixel PX2 of the light emitting element layer EML may include the second emission area EMA2 and the light blocking area NEM, and the third sub-pixel PX3 of the light emitting element layer EML may include the third emission area EMA3 and the light blocking area NEM. The first to third emission areas EMA1, EMA2, and EMA3 may be areas from which light emitted from the light emitting element ED is emitted, and the light blocking area NEM may be defined as an area from which light is not emitted because the light emitted from the light emitting element ED has not reached the area.

Each of the first to third emission areas EMA1, EMA2, and EMA3 may include an area in which the light emitting element ED is disposed and an area adjacent thereto. The first to third emission areas EMA1, EMA2, and EMA3 may further include areas from which the light emitted from the light emitting element ED is reflected or refracted by another member to be emitted.

Each sub-pixel PXn may further include a sub-region SAn (where n is a natural number of 1 to 3) disposed in the light blocking area NEM. Specifically, the first sub-pixel PX1 may include a first sub-region SA1 disposed in the light blocking area NEM, the second sub-pixel PX2 may include a second sub-region SA2 disposed in the light blocking area NEM, and the third sub-pixel PX3 may include a third sub-region SA3 disposed in the light blocking area NEM.

The light emitting element ED may not be disposed in each sub-region SAn. Each sub-region SAn may be disposed on an upper side of an emission area EMAn (where n is a natural number) (or a side in the second direction DR2) within each sub-pixel PXn. For example, the first sub-region SA1 may be disposed on an upper side of the first emission area EMA1 in the first sub-pixel PX1, the second sub-region SA2 may be disposed on an upper side of the second emission area EMA2 in the second sub-pixel PX2, and the third sub-region SA3 may be disposed on an upper side of the third emission area EMA3 in the third sub-pixel PX3. For example, each sub-region SAn may be disposed between the emission areas EMAn of the respective sub-pixels PXn disposed adjacent to each other in the second direction DR2.

Each sub-region SAn may include a separation portion ROPn (where n is a natural number. For example, the first sub-region SA1 may include a first separation portion ROP1, the second sub-region SA2 may include a second separation portion ROP2, and the third sub-region SA3 may include a third separation portion ROP3. The separation portion ROPn of each sub-region SAn may be an area, in which each of the first electrode 210 and the second electrode 220 included in the electrode layer 200 included in each of the sub-pixels PXn adjacent to each other in the second direction DR2, is separated from each other.

The light emitting element layer EML may be disposed on the via layer 165. The light emitting element layer EML may include the electrode layer 200, the first bank 400, the second bank 600, the light emitting elements ED, the contact electrode 700, the insulating layers 510, 520, 530, and 540, and the filling layer 800.

The first bank 400 is disposed on the via layer 165. The first bank 400 may be disposed directly on the top surface of the via layer 165. The first bank 400 may be disposed in the emission area EMA.

The first bank 400 may extend in the second direction DR2 in the emission area EMA. The length of the first bank 400 in the second direction DR2 may be smaller than the length of the emission area EMA surrounded by the second bank 600 in the second direction DR2.

The first bank 400 may include sub-banks 410 and 420 spaced apart from each other in the emission area EMA. The sub-banks 410 and 420 may extend in the second direction DR2 while being spaced apart from each other in the first direction DR1. In an embodiment, the first bank 400 may include the first sub-bank 410 and the second sub-bank 420. The first sub-bank 410 may be disposed on a left side of the emission area EMA in a plan view. The second sub-bank 420 may be disposed on a right side of the emission area EMA in a plan view while being spaced apart from the first sub-bank 410 in the first direction DR1. The light emitting elements ED may be arranged between the sub-banks 410 and 420 spaced apart from each other.

The first bank 400 may change the traveling direction of the light, emitted from the light emitting element ED toward the inclined side surface of the first bank 400, to an upward direction (e.g., a display direction). For example, the first bank 400 may serve as a reflective partition wall that provides a space where the light emitting element ED is disposed and changes the traveling direction of the light emitted from the light emitting element ED to the display direction.

On the other hand, although it is illustrated in the drawing that the side surface of the first bank 400 is inclined in a linear shape, the disclosure is not limited thereto. For example, the side surface (or outer surface) of the first bank 400 may have a curved semicircular or semi-elliptical shape. In an embodiment, the first bank 400 may include an organic insulating material such as polyimide (PI), but the disclosure is not limited thereto.

The electrode layer 200 may be disposed on the first bank 400 and the via layer 165 exposed by the first bank 400. The electrode layer 200 may extend in a direction and may be disposed for each sub-pixel PXn. The electrode layer 200 may extend in the second direction DR2 and may be disposed over the emission area EMA and the sub-region SA of the sub-pixel PXn. The electrode layer 200 may be disposed on the first bank 400 and the via layer 165 exposed by the first bank 400 in the emission area EMA, and may be disposed on the via layer 165 in the light blocking area NEM.

Each of the electrode layers 200 may extend in the second direction DR2 and may include electrodes spaced apart from each other in the first direction DR1. The electrode layer 200 may include the first electrode 210 and the second electrode 220 spaced apart from each other.

The first electrode 210 may be disposed on the first sub-bank 410 in the emission area EMA, and the second electrode 220 may be disposed on the second sub-bank 420 in the emission area EMA. The first electrode 210 and the second electrode 220 may be disposed at least on the inclined surfaces of the first sub-bank 410 and the second sub-bank 420, respectively. The first electrode 210 and the second electrode 220 may be disposed to cover (or overlap) at least one side surface of the first sub-bank 410 and the second sub-bank 420 facing each other to reflect the light emitted from the light emitting element ED.

The gap in the first direction DR1 between the first electrode 210 and the second electrode 220 may be smaller than the gap in the first direction DR1 between the first sub-bank 410 and the second sub-back 420.

The first electrode 210 may be electrically connected to the first conductive pattern CDP through a first electrode contact hole CTD penetrating the via layer 165. The first electrode 210 may contact (or electrically contact) the top surface of the first conductive pattern CDP exposed by the first electrode contact hole CTD. The first electrode 210 may be electrically connected to the transistor TR through the first conductive pattern CDP. In the drawing, the first electrode contact hole CTD is disposed to overlap the second bank 600 in the third direction DR3, but the position of the first electrode contact hole CTD is not limited thereto.

The second electrode 220 may be electrically connected to the second voltage line VL2 through a second electrode contact hole CTS penetrating the via layer 165. The second electrode 220 may contact the top surface of the second voltage line VL2 exposed by the second electrode contact hole CTS. A second power voltage may be applied to the second electrode 220 through the second voltage line VL2. In the drawing, the second electrode contact hole CTS is disposed to overlap the second bank 600 in the third direction DR3, but the position of the second electrode contact hole CTS is not limited thereto.

The first electrode 210 and the second electrode 220 disposed in each sub-pixel PXn may each extend in the second direction DR2 in a plan view, and may be respectively separated from the first electrode 210 and the second electrode 220 of the sub-pixel PXn adjacent in the second direction DR2 in the separation portion ROP of the sub-region SA. The disposition of the first electrode 210 and the second electrode 220 spaced apart in the second direction DR2 may be formed by forming an electrode line used in the process of aligning the light emitting elements ED so that it extends in the second direction DR2, aligning the light emitting elements ED, and then separating the electrode line from the separation portion ROP of the sub-region SA by a subsequent process. The electrode line may be used for generating an electric field in the pixel PX to align the light emitting elements ED during the manufacturing process of the display device 10.

The first electrode 210 and the second electrode 220 may be electrically connected to the light emitting element ED. The first electrode 210 and the second electrode 220 may be respectively connected to both ends of the light emitting element ED by the first contact electrode 710 and the second contact electrode 720, and may transmit the electric signal applied from the circuit element layer CCL to the light emitting element ED.

Each of the electrode layers 200 may include a conductive material having high reflectivity. For example, the electrode layer 200 may include, as a material having high reflectivity, a metal such as silver (Ag), copper (Cu), aluminum (Al), molybdenum (Mo), titanium (Ti), or the like, or an alloy including aluminum (Al), nickel (Ni), lanthanum (La), or the like. The electrode layer 200 may reflect the light emitted from the light emitting element ED and traveling toward the side surface of the first bank 400, in the upward direction of each sub-pixel PXn. However, the disclosure is not limited thereto, and each of the electrode layers 200 may further include a transparent conductive material. For example, the electrode layer 200 may include a material such as ITO, IZO, and ITZO. In some embodiments, the electrode layer 200 may have a structure in which at least one transparent conductive material and at least one metal layer having high reflectivity are stacked, or may be formed as one layer including them. For example, the electrode layer 200 may have a stacked structure of ITO/Ag/ITO, ITO/Ag/IZO, ITO/Ag/ITZO/IZO, or the like.

The first insulating layer 510 may be disposed on the electrode layer 200. The first insulating layer 510 may be disposed to cover the electrode layer 200 and the via layer 165 exposed by the electrode layer 200. The first insulating layer 510 may include contact portions that expose at least a part of the first electrode 210 and the second electrode 220. The contact electrode 700 and the electrode layer 200 may be electrically connected by the contact portions exposing at least a part of the first electrode 210 and the second electrode 220. On the other hand, the drawing illustrates that the contact portion of the first insulating layer 510 exposing a part of the electrode layer 200 is disposed in the emission area EMA, but the disclosure is not limited thereto. The contact portion of the first insulating layer 510 exposing a part of the electrode layer 200 may be positioned in the sub-region SA of each sub-pixel PXn.

The first insulating layer 510 may protect the electrode layer 200 and to insulate the first electrode 210 and the second electrode 220 from each other. Further, the first insulating layer 510 may prevent the light emitting elements ED that are arranged on the first insulating layer 510 from being damaged by directly contacting other members disposed therebelow. The first insulating layer 510 may include an inorganic insulating material.

The second bank 600 may be disposed on the first insulating layer 510. The second bank 600 may be disposed in the form of a grid pattern including portions extending in the first and second directions DR1 and DR2 in a plan view.

The second bank 600 may be disposed across the boundary of each sub-pixel PXn to divide the adjacent sub-pixels PXn and may divide the emission area EMA and the sub-region SA of each sub-pixel PXn. Further, the second bank 600 has a height greater than that of the first bank 400 and divides the emission area EMA and the sub-region SA. Accordingly, in an inkjet printing step for aligning the light emitting elements ED during the manufacturing process of the display device 10, ink in which the light emitting elements ED are dispersed can be sprayed into the emission area EMA without being mixed with an adjacent sub-pixel PXn. The second bank 600 may include an organic insulating material, for example, polyimide (PI), but the disclosure is not limited thereto.

The light emitting elements ED may be disposed on the first insulating layer 510 in the emission area EMA. The light emitting element ED may be disposed between the first sub-bank 410 and the second sub-bank 420. The light emitting element ED may be disposed on the insulating layer 510 such that both ends thereof are located on the first electrode 210 and the second electrode 220, respectively.

The light emitting elements ED may be disposed to be spaced apart from each other in the second direction DR2 in which the first and second electrodes 210 and 220 extend, and may be aligned substantially parallel to each other. The light emitting element ED may extend in a direction, and the length of the light emitting element ED may be greater than the shortest gap between the first electrode 210 and the second electrode 220 spaced apart from each other in the first direction DR1. The light emitting element ED may be disposed such that at least one end thereof is located on any one of the first electrode 210 and the second electrode 220 or such that both ends thereof are located on the first electrode 210 and the second electrode 220, respectively.

The second insulating layer 520 may be disposed on the light emitting element ED. The second insulating layer 520 may be disposed to partially surround the outer surface of the light emitting element ED, but not to cover (or overlap) both ends of the light emitting element ED. Therefore, the width of the second insulating layer 520 in the first direction DR1 may be smaller than the length of the light emitting element ED in the first direction DR1 that is the extension direction of the light emitting element ED. The portion of the second insulating layer 520 disposed on the light emitting element ED may be arranged to extend in the second direction DR2 on the first insulating layer 510 in a plan view, so that it may form a linear or island-like pattern in each sub-pixel PXn. The second insulating layer 520 may protect and affix the light emitting element ED in the manufacturing process of the display device 10.

The contact electrode 700 may be disposed on the second insulating layer 520. The contact electrode 700 may include contact electrodes spaced apart from each other. For example, the contact electrode 700 may include the first contact electrode 710 and the second contact electrode 720 spaced apart from each other.

The first contact electrode 710 may be disposed on the first electrode 210. The first contact electrode 710 may be disposed on the first electrode 210 and the second insulating layer 520. The first contact electrode 710 may be disposed to expose a part of the top surface of the second insulating layer 520.

The first contact electrode 710 may extend in the second direction DR2. The first contact electrode 710 may contact the first electrode 210 and a first end of the light emitting element ED. Specifically, the first contact electrode 710 may contact the first end of the light emitting element ED exposed by the second insulating layer 520 in the emission area EMA. The first contact electrode 710 may contact the first electrode 210 exposed by a contact portion penetrating the first insulating layer 510. Since the first contact electrode 710 contacts each of the first electrode 210 and the first end of the light emitting element ED, it may electrically connect the light emitting element ED to the first electrode 210.

The third insulating layer 530 may be disposed on the first contact electrode 710. The third insulating layer 530 may be disposed on the first contact electrode 710 to cover the first contact electrode 710. The third insulating layer 530 may insulate the first contact electrode 710 and the second contact electrode 720 from each other. The third insulating layer 530 may be disposed to cover the first contact electrode 710 and may be aligned with a sidewall of the second insulating layer 520.

The second contact electrode 720 may be disposed on the second electrode 220. The second contact electrode 720 may be disposed on the second electrode 220 and the third insulating layer 530.

The second contact electrode 720 may extend in the second direction DR2. The second contact electrode 720 may contact the second electrode 220 and a second end of the light emitting element ED. Specifically, the second contact electrode 720 may contact the second end of the light emitting element ED exposed by the second insulating layer 520 and the third insulating layer 530 in the emission area EMA. The second contact electrode 720 may contact the second electrode 220 exposed by a contact portion penetrating the first insulating layer 510. Since the second contact electrode 720 contacts each of the second electrode 220 and the second end of the light emitting element ED, it may electrically connect the light emitting element ED to the second electrode 220.

The first end of the light emitting element ED exposed by the second insulating layer 520 may be electrically connected to the first electrode 210 by the first contact electrode 710, and the second end of the light emitting element ED exposed by the second insulating layer 520 and the third insulating layer 530 may be electrically connected to the second electrode 220 by the second contact electrode 720.

On the other hand, the drawing illustrates that the first contact electrode 710 and the second contact electrode 720 are formed on different layers with the third insulating layer 530 interposed therebetween, but the disclosure is not limited thereto. For example, the first contact electrode 710 and the second contact electrode 720 may be formed on substantially the same layer, and may be spaced apart from each other with the second insulating layer 520 interposed therebetween. In this case, the third insulating layer 530 may be omitted.

The contact electrode 700 may include a conductive material. For example, the contact electrode 700 may include ITO, IZO, ITZO, aluminum (Al), or the like. For example, the contact electrode 700 may include a transparent conductive material, and light emitted from the light emitting element ED may pass through the contact electrode 700 to travel toward the first electrode 210 and the second electrode 220 and may be reflected from the outer surface of the first electrode 210 and the second electrode 220.

A fourth insulating layer 540 may be disposed on the contact electrode 700. The fourth insulating layer 540 may be entirely disposed on the substrate SUB. The fourth insulating layer 540 may function to protect the members disposed on the substrate SUB from an external environment.

The filling layer 800 may be disposed on the fourth insulating layer 540. The filling layer 800 may be disposed on the fourth insulating layer 540 in an opening partitioned by the second bank 600. The filling layer 800 may planarize a step formed by members disposed therebelow.

Hereinafter, the light emitting elements ED disposed in each sub-pixel PXn of a pixel PX will be described in detail.

In an embodiment, the first light emitting element ED1 may be disposed on the light emitting element layer EML of the first sub-pixel PX1 for emission of light of the first color, the second light emitting element ED2 may be disposed on the light emitting element layer EML of the second sub-pixel PX2 for emission of light of the second color, and the third light emitting element ED3 may be disposed on the light emitting element layer EML of the third sub-pixel PX3 for emission of light of the third color.

On the other hand, as will be described below, the light emitting element ED may include an element active layer 33 (refer to FIG. 5). The light emitting element ED may emit light having wavelength bands different from each other according to a material included in the element active layer 33 of the light emitting element ED. Hereinafter, in the specification, the light emitting element ED may be classified into a first type light emitting element (or first light emitting element) ED_B, a second type light emitting element (or second light emitting element) ED_G, and a third type light emitting element (or third light emitting element) ED_R according to a peak wavelength band in which the peak wavelength of light emitted by the light emitting element ED is positioned. The first type light emitting element ED_B may emit the first light, the second type light emitting element ED_G may emit the second light, and the third type light emitting element ED_R may emit the third light. The peak wavelength of the first light, the peak wavelength of the second light, and the peak wavelength of the third light may be different from each other. For example, the peak wavelength of the first light, the peak wavelength of the second light, and the peak wavelength of the third light may be included in wavelength bands different from each other. In the specification, the phrase "the light emitting element ED emits light having a peak wavelength in a specific wavelength band" may mean that "the peak wavelength of the light emitted by the light emitting element ED is positioned within a specific wavelength band." For example, the phrase "the light emitting element emits light having a peak wavelength in a range of about 1 nm to about 3 nm" may mean "the peak wavelength of the light emitted by the light emitting element is positioned within a wavelength band in a range of about 1 nm to about 3 nm."

Specifically, the first type light emitting element ED_B may emit the third color light or the blue light having a peak wavelength in a range of about 480 nm or less, preferably a peak wavelength in a range of about 445 nm to about 480 nm. The second type light emitting element ED_G may emit the second color light or the green light having a peak wavelength in a range of about 480 nm to about 580 nm. The third type light emitting element ED_R may emit the first color light or the red light having a peak wavelength in a range of about 580 nm to about 780 nm.

The first light emitting element ED1 may be disposed in the first emission area EMA1 of the first sub-pixel PX1. The first light emitting element ED1 may include a first main light emitting element MED1 and a first sub-light emitting element SED1 that emit light having wavelength bands different from each other.

The first main light emitting element MED1 may include first type light emitting elements ED_B that emit light of a first peak wavelength band. Each first type light emitting element ED_B may emit the third color light or the blue light having a peak wavelength in a range of about 445 nm to about 480 nm.

The first sub-light emitting element SED1 may include second type light emitting elements ED_G that emit light of a second peak wavelength band different from the first peak wavelength band. Each second type light emitting element ED_G may emit the second color light or the green light having a peak wavelength in a range of about 480 nm to about 580 nm.

The number of first main light emitting elements MED1 and the number of first sub-light emitting elements SED1 may be different from each other. For example, the number of the first type light emitting elements ED_B included in the first main light emitting element MED1 and the number of the second type light emitting elements ED_G included in the first sub-light emitting element SED1 may be different from each other. The number of first main light emitting elements MED1 may be greater than the number of first sub-light emitting elements SED1. Accordingly, with respect to the first light emitting element ED1, the ratio of the first main light emitting element MED1 may be greater than the ratio of the first sub-light emitting element SED1. For example, as illustrated in FIG. 4, the number of the first main light emitting elements MED1 included in the first light emitting element ED1 is nine, and the number of the first sub-light emitting elements SED1 included in the first light emitting element ED1 is three, and thus the ratio of the first main light emitting element MED1 to the first light emitting element ED1 may be greater than the ratio of the first sub-light emitting element SED1 to the first light emitting element ED1. On the other hand, the number of the first main light emitting elements MED1 and the number of the first sub-light emitting elements SED1 illustrated in the drawing are illustrative, and the number of the first main light emitting elements MED1 and the number of the first sub-light emitting elements SED1 are not limited thereto.

The second light emitting element ED2 may be disposed in the second emission area EMA2. The second light emitting element ED2 may include a second main light emitting element MED2 and a second sub-light emitting element SED2 that emit light of wavelength bands different from each other.

The second main light emitting element MED2 may include the first type light emitting elements ED_B that emit light of a first peak wavelength band. Each first type light emitting element ED_B may emit the third color light or the blue light having a peak wavelength in a range of about 445 nm to about 480 nm.

The second sub-light emitting element SED2 may include the second type light emitting elements ED_G that emit light of the second peak wavelength band different from the first peak wavelength band. Each second type light emitting element ED_G may emit the second color light or the green light having a peak wavelength in a range of about 480 nm to about 580 nm.

The number of second main light emitting elements MED2 and the number of second sub-light emitting elements SED2 may be different from each other. For example, the number of first type light emitting elements ED_B included in the second main light emitting element MED2 and the number of second type light emitting elements ED_G included in the second sub-light emitting element SED2 may be different from each other. The number of second main light emitting elements MED2 may be greater than the number of second sub-light emitting elements SED2. Accordingly, with respect to the second light emitting element ED2, the ratio of the second main light emitting element MED2 may be greater than the ratio of the second sub-light emitting element SED2. For example, as illustrated in FIG. 4, the number of second main light emitting elements MED2 included in the second light emitting element ED2 is nine, and the number of second sub-light emitting elements SED2 included in the second light emitting element ED2 is three, and thus the ratio of the second main light emitting element MED2 to the second light emitting element ED2 may be greater than the ratio of the second sub-light emitting element SED2 to the second light emitting element ED2. On the other hand, the number of second main light emitting elements MED2 and the number of second sub-light emitting elements SED2 illustrated in the drawing are illustrative, and the number of second main light emitting elements MED2 and the number of second sub-light emitting elements SED2 are not limited thereto.

The third light emitting element ED3 may be disposed in the third emission area EMA3. The third light emitting element ED3 may include the first type light emitting elements ED_B that emit light of a first peak wavelength band. Each first type light emitting element ED_B may emit the third color light or the blue light having a peak wavelength in a range of about 445 nm to about 480 nm.

The light emitting element layer EML of the display device 10 according to an embodiment may include a light emitting element constituted with (or include) different types of light emitting elements according to the colors which the first to third sub-pixels PX1, PX2, and PX3 included in a pixel PX emit.

The light emitting element layer EML of the first sub-pixel PX1 for emission of light of the first color may include the first light emitting element ED1, and the first light emitting element ED1 may include the first main light emitting element MED1 and the first sub-light emitting element SED1 that has a ratio smaller than the ratio of the first main light emitting element MED1. The first light emitting element ED1 may include different types of light emitting elements ED.

Specifically, the first main light emitting element MED1 may include the first type light emitting elements ED_B emitting light of the third color different from the first color, and the first sub-light emitting element SED1 may include the second type light emitting elements ED_G emitting light of the second color different from the first color and the third color. For example, the first main light emitting element MED1 may include the first type light emitting elements ED_B emitting light of the blue color different from the red color exhibited by the first sub-pixel PX1, and the first sub-light emitting element SED1 may include the second type light emitting elements ED_G emitting light of the green color different from the red color exhibited by the first sub-pixel PX1 and the blue color emitted by the first type light emitting element ED_B.

The light emitting element layer EML of the second sub-pixel PX2 for emission of the second color light may include the second light emitting element ED2. Similar to the first light emitting element ED1, the second light emitting element ED2 may include different types of light emitting elements ED. The second light emitting element ED2 may be constituted with (or include) the light emitting elements ED of the same type as those included in the first light emitting element ED1 of the first sub-pixel PX1. For example, the second light emitting element ED2 may include the second main light emitting element MED2 and the second sub-light emitting element SED2 that has a ratio smaller than the ratio of the second main light emitting element MED2. The second light emitting element ED2 may include the second main light emitting element MED2 including first type light emitting elements ED_B and the second sub-light emitting element SED2 including second type light emitting elements ED_G.

Specifically, the second main light emitting element MED2 may include the first type light emitting elements ED_B emitting light of the third color different from the second color, and the second sub-light emitting element SED2 may include the second type light emitting elements ED_G emitting light of the same color as the second color. For example, the second main light emitting element MED2 may include the first type light emitting elements ED_B emitting light of the blue color different from the green color exhibited by the second sub-pixel PX2, and the second sub-light emitting element SED2 may include the second type light emitting elements ED_G emitting light of the green color that is the same as the green color exhibited by the second sub-pixel PX2.

The light emitting element layer EML of the third sub-pixel PX3 for emission of light of the third color may include the third light emitting element ED3, and the third light emitting element ED3 may include the light emitting elements ED of the same type in a manner different from the first light emitting element ED1 and the second light emitting element ED2.

Specifically, the third light emitting element ED3 may include the first type light emitting elements ED_B that emit light of the third color that is the same as the third color exhibited by the third sub-pixel PX3. For example, the third light emitting element ED3 may include the first type light emitting elements ED_B that emit light of the blue color that is the same as the blue color exhibited by the third sub-pixel PX3.

The display device 10 according to the embodiment may include the first and second light emitting elements ED1 and ED2, which are constituted with the first type light emitting element ED_B and the second type light emitting element ED_G that have peak wavelength bands different from each other, in the light emitting element layer EML of the first sub-pixel PX1 for emission of the red light and the second sub-pixel PX2 for emission of the green light. As will be described below, the first type light emitting element ED_B having the first peak wavelength band may have high wavelength conversion efficiency for the first and second wavelength conversion materials WCP1 and WCP2, but in case that a wavelength conversion is performed, the traveling direction of the light may be random, so that the straightness of light may be reduced. On the other hand, the second type light emitting element ED_G may have relatively low wavelength conversion efficiency for the first and second wavelength conversion materials WCP1 and WCP2, compared to the first type light emitting element ED_B, but the straightness of light may be relatively high. Accordingly, in each of the first sub-pixel PX1 and the second sub-pixel PX2, the main light emitting element may be constituted with the first type light emitting element ED_B having high wavelength conversion efficiency, and the sub-light emitting element may be constituted with the second type light emitting element ED_G having high straightness of light, so that the front surface luminance of the display device 10 may be improved.

Figure 5:
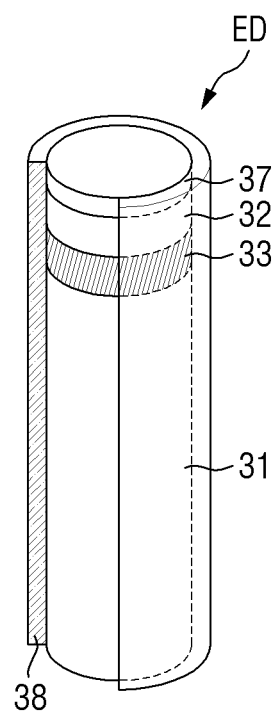
FIG. 5 is a schematic perspective view of a light emitting element according to an embodiment.

FIG. 5 is a schematic perspective view of a light emitting element according to an embodiment.

Referring to FIG. 5, the light emitting element ED may be a particulate element and may have a rod or cylindrical shape having a predetermined aspect ratio. The length of the light emitting element ED may be greater than the diameter of the light emitting element ED, and the aspect ratio may be about 6:5 to about 100:1, but the disclosure is not limited thereto.

The light emitting element ED may have a size of a nanometer scale (equal to or greater than about 1 nm and less than about 1 μm) to a micrometer scale (equal to or greater than about 1 μm and less than about 1 mm). In an embodiment, both the diameter and the length of the light emitting element ED may be on a nanometer scale, or on a micrometer scale. In some embodiments, the diameter of the light emitting element ED may be on a nanometer scale, while the length of the light emitting element ED may be on a micrometer scale. In some embodiments, some of the light emitting elements ED may have a diameter and/or length on a nanometer scale, while some others of the light emitting elements ED may have a diameter and/or length on a micrometer scale.

In an embodiment, the light emitting element ED may be an inorganic light emitting diode. The inorganic light emitting diode may include semiconductor layers. For example, the inorganic light emitting diode may include a first conductive (e.g., n-type) semiconductor layer, a second conductive (e.g., p-type) semiconductor layer, and an active semiconductor layer interposed therebetween. The active semiconductor layer may receive holes and electrons from the first conductive semiconductor layer and the second conductive semiconductor layer, respectively, and the holes and electrons that have reached the active semiconductor layer may be coupled (or combined) to emit light.

In an embodiment, the above-described semiconductor layers may be sequentially stacked in a direction, which is a length direction of the light emitting element ED. As shown in FIG. 5, the light emitting element ED may include a first semiconductor layer 31, an element active layer 33, and a second semiconductor layer 32 that are sequentially stacked in a direction. The first semiconductor layer 31, the element active layer 33, and the second semiconductor layer 32 may be the first conductive semiconductor layer, the active semiconductor layer, and the second conductive semiconductor layer described above, respectively.

The first semiconductor layer 31 may be doped with a first conductive dopant. The first conductive dopant may be Si, Ge, or Sn. In an embodiment, the first semiconductor layer 31 may be n-GaN doped with n-type Si.

The second semiconductor layer 32 may be spaced apart from the first semiconductor layer 31 with the element active layer 33 interposed therebetween. The second semiconductor layer 32 may be doped with a second conductive dopant such as Mg, Zn, Ca, Se, Ba, or the like. In an embodiment, the second semiconductor layer 32 may be p-GaN doped with p-type Mg.

The element active layer 33 may include a material having a single or multiple quantum well structure. As described above, the element active layer 33 may emit light by coupling of electron-hole pairs according to an electrical signal applied through the first semiconductor layer 31 and the second semiconductor layer 32.

In some embodiments, the element active layer 33 may have a structure in which semiconductor materials having large band gap energy and semiconductor materials having small band gap energy are alternately stacked, and may include other group III to V semiconductor materials according to the wavelength band of the emitted light.

Light emitted from the element active layer 33 may be emitted not only to both end surfaces of the light emitting element ED in the length direction, but also to the outer peripheral surface (or outer surface or side surface) of the light emitting element ED. For example, the directionality of light emitted from the element active layer 33 is not limited to a direction.

The light emitting element ED may further include an element electrode layer 37 disposed on the second semiconductor layer 32. The element electrode layer 37 may contact the second semiconductor layer 32. The element electrode layer 37 may be an Ohmic contact electrode. However, the element electrode layer 37 is not limited thereto and may be a Schottky contact electrode.

In case that both ends of the light emitting element ED are electrically connected to the first and second contact electrodes 710 and 720 to apply an electrical signal to the first and second semiconductor layers 31 and 32, the element electrode layer 37 may be disposed between the second semiconductor layer 32 and the electrode to reduce resistance. The element electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). The element electrode layer 37 may include a semiconductor material doped with an n- or p-type dopant.

The light emitting element ED may further include an element insulating layer 38 surrounding the outer peripheral surfaces of the first semiconductor layer 31, the second semiconductor layer 32, and the element active layer 33, and/or the element electrode layer 37. The element insulating layer 38 may be disposed to surround at least the outer surface of the element active layer 33 and may extend in a direction in which the light emitting element ED extends. The element insulating layer 38 may function to protect members (e.g., the first semiconductor layer 31, the second semiconductor layer 32, and the element active layer 33, and the element electrode layer 37). Since the element insulating layer 38 is made of materials having insulating properties, it is possible to prevent an electrical short circuit that may occur in case that the element active layer 33 directly contacts an electrode through which an electric signal is transmitted to the light emitting element ED. Further, since the element insulating layer 38 includes the element active layer 33 to protect the outer peripheral surfaces of the first and second semiconductor layers 31 and 32, it is possible to prevent a degradation in light emission efficiency.

As described above, the light emitting element ED may include the first type light emitting element ED_B, the second type light emitting element ED_G, and the third type light emitting element ED_R according to the color of light or the peak wavelength band of the emitted light. The first to third type light emitting elements ED_B, ED_G, and ED_R may emit light of different colors depending on the material of the element active layer 33 included therein.

The first type light emitting element ED_B may emit blue light. The first type light emitting element ED_B may include the element active layer 33 including nitrogen (N). The element active layer 33 of the first type light emitting element ED_B may include a material such as AlGaN or AlGaInN. For example, the element active layer 33 of the first type light emitting element ED_B may include AlGaInN as a quantum layer and AlInN as a well layer, so that as described above, the first type light emitting element ED_B may emit the third color light or the blue light having a peak wavelength in a range of about 445 nm to about 480 nm.

The second type light emitting element ED_G may emit green light. The second type light emitting element ED_G may include the element active layer 33 including nitrogen (N). The element active layer 33 of the first type light emitting element ED_B may include a material such as AlGaN or AlGaInN. For example, the second type light emitting element ED_G may emit the second color light or the green light having a peak wavelength in a range of about 480 nm to about 580 nm.

The third type light emitting element ED_R may emit red light. The third type light emitting element ED_R may include the element active layer 33 including phosphorus (P). The element active layer 33 of the third type light emitting element ED_R may include a material such as AlGaP, AlInGaP, GaP, and AlInP. For example, the element active layer 33 of the third type light emitting element ED_R may include AlGaP or AlInGaP as a quantum layer and GaP or AlInP as a well layer, so that as described above, the third type light emitting element ED_R may emit the first color light or the red light having a peak wavelength in a range of about 580 nm to about 780 nm. On the other hand, the third type light emitting element ED_R may further include a cladding layer disposed adjacent to the element active layer 33.

Figure 6:
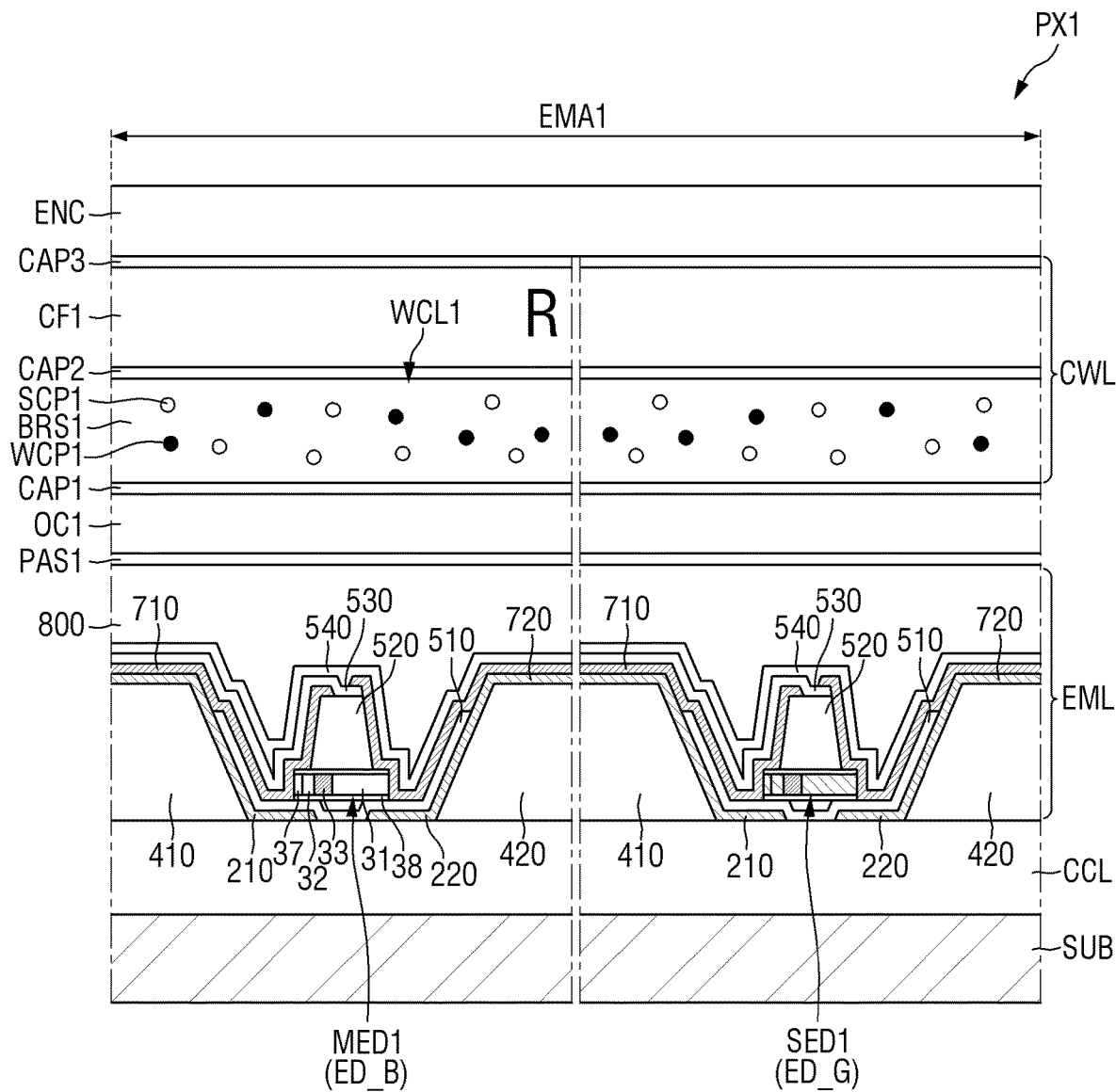
FIG. 6 is a schematic cross-sectional view illustrating an example of a first emission area of a first sub-pixel included in the display device of FIG. 4.
Figure 7:
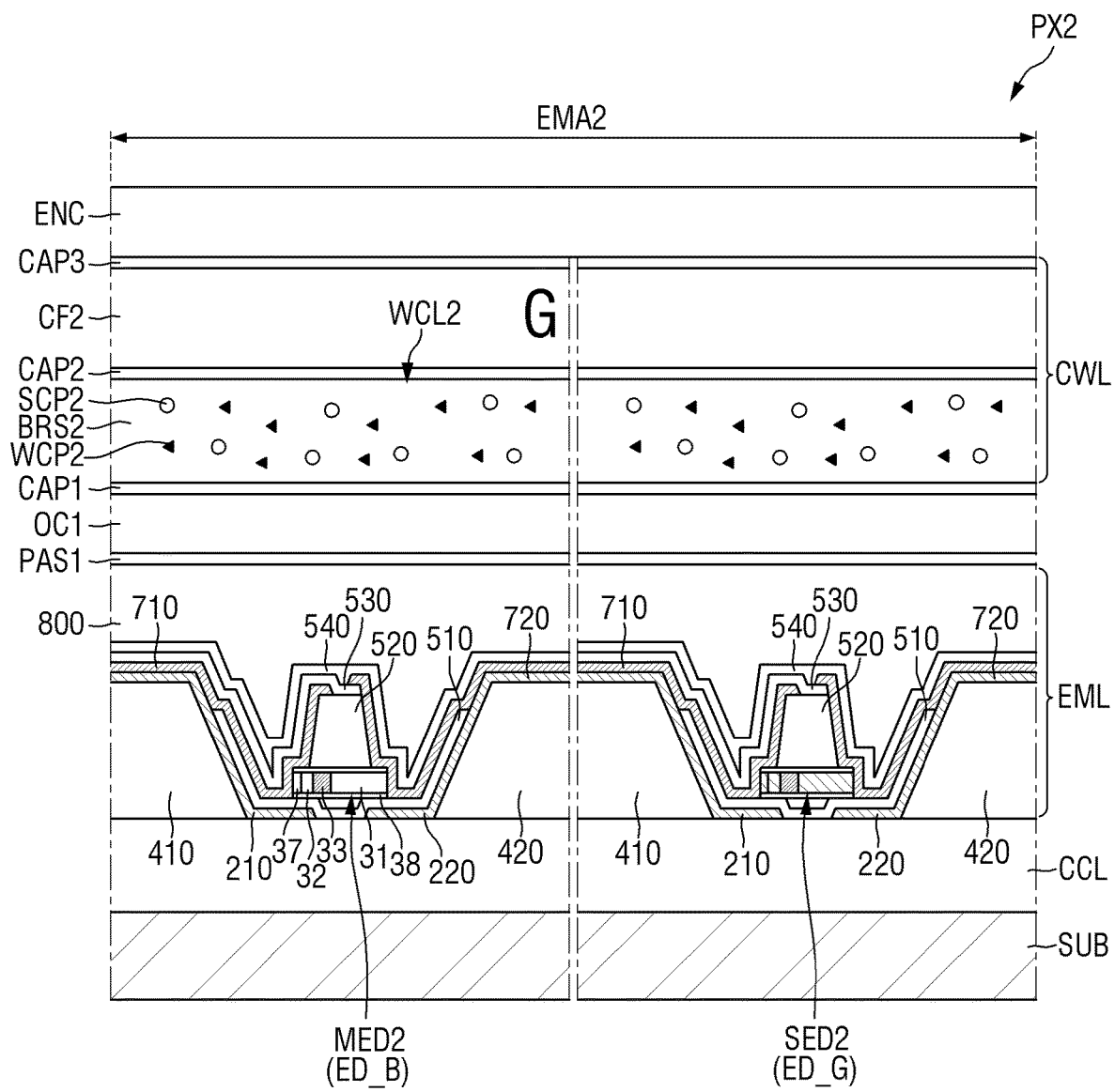
FIG. 7 is a schematic cross-sectional view illustrating an example of a second emission area of a second sub-pixel included in the display device of FIG. 4.
Figure 8:
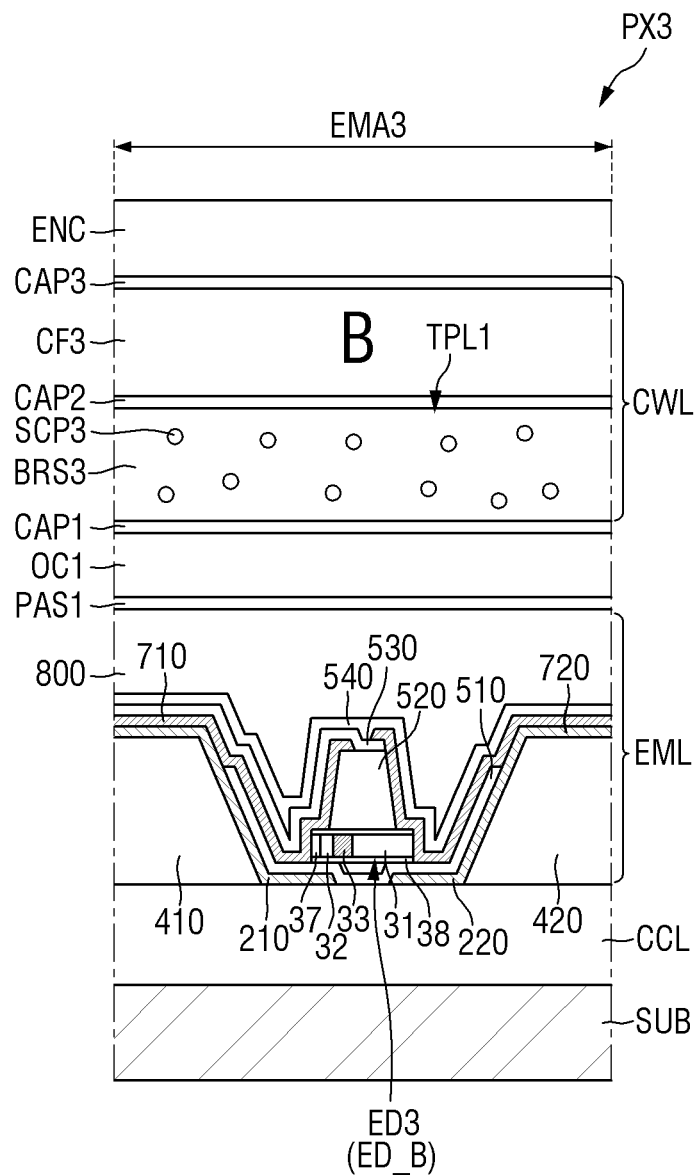
FIG. 8 is a schematic cross-sectional view illustrating an example of a third emission area of a third sub-pixel included in the display device of FIG. 4.

FIG. 6 is a schematic cross-sectional view illustrating an example of a first emission area of a first sub-pixel included in the display device of FIG. 4. FIG. 7 is a schematic cross-sectional view illustrating an example of a second emission area of a second sub-pixel included in the display device of FIG. 4. FIG. 8 is a schematic cross-sectional view illustrating an example of a third emission area of a third sub-pixel included in the display device of FIG. 4.

Referring to FIGS. 3 to 8, the light emitting element ED may extend in a direction parallel to the top surface of the substrate SUB. The semiconductor layers included in the light emitting element ED may be sequentially arranged in the direction parallel to the top surface of the substrate SUB. For example, the first semiconductor layer 31, the element active layer 33, and the second semiconductor layer 32 of the light emitting element ED may be sequentially arranged in the direction parallel to the top surface of the substrate SUB.

Specifically, in the light emitting element ED, the first semiconductor layer 31, the element active layer 33, the second semiconductor layer 32, and the element electrode layer 37 may be sequentially formed in the direction parallel to the top surface of the substrate SUB in a cross-sectional view across both ends of the light emitting element ED.

The light emitting element ED may be disposed such that a first end thereof is located on the first electrode 210 and a second end thereof is located on the second electrode 220. However, the disclosure is not limited thereto, and the light emitting element ED may be disposed such that the first end thereof is located on the second electrode 220 and the second end thereof is located on the first electrode 210.

The second insulating layer 520 may be disposed on the light emitting element ED. The second insulating layer 520 may be disposed to surround the outer surface of the light emitting element ED. The second insulating layer 520 may be disposed to surround the outer surface of the light emitting element ED in the area in which the light emitting element ED is disposed, and may be disposed on the first insulating layer 510 in the area in which the light emitting element ED is not disposed.

The first contact electrode 710 may contact a first end of the light emitting element ED exposed by the second insulating layer 520. Specifically, the first contact electrode 710 may be disposed to surround the outer surface and a first end surface of the light emitting element ED exposed by the second insulating layer 520. The first contact electrode 710 may contact the element insulating layer 38 and the element electrode layer 37 of the light emitting element ED.

The second contact electrode 720 may contact the second end of the light emitting element ED exposed by the second insulating layer 520 and the third insulating layer 530. Specifically, the second contact electrode 720 may be disposed to surround the outer surface and a second end surface of the light emitting element ED exposed by the second insulating layer 520 and the third insulating layer 530. The second contact electrode 720 may contact the element insulating layer 38 and the first semiconductor layer 31 of the light emitting element ED.

Hereinafter, a cross-sectional structure between the light emitting element ED and the color control layer CWL disposed in the emission area EMA of each sub-pixel PXn will be described.

Referring to FIGS. 3 and 6, the light emitting element layer EML of the first sub-pixel PX1 may include the first light emitting element ED1. The first light emitting element ED1 may be disposed in the first emission area EMA1. As described above, the first light emitting element ED1 may include the first main light emitting element MED1 including the first type light emitting elements ED_B and the first sub-light emitting element SED1 including the second type light emitting elements ED_G. The first main light emitting element MED1 and the first sub-light emitting element SED1 may be disposed on the same layer. For example, the first main light emitting element MED1 and the first sub-light emitting element SED1 may not overlap in the third direction DR3 and may overlap in a horizontal direction. Specifically, the first main light emitting element MED1 and the first sub-light emitting element SED1 may overlap each other in the second direction DR2.

Accordingly, the first type light emitting elements ED_B included in the first main light emitting element MED1 and the second type light emitting elements ED_G included in the first sub-light emitting element SED1 may be disposed on the same layer. Accordingly, the first type light emitting elements ED_B and the second type light emitting elements ED_G disposed in the first emission area EMA1 may not overlap in the third direction DR3 and may overlap each other in the second direction DR2.

The first contact electrode 710 may extend in the second direction DR2 to contact a first end of the first main light emitting element MED1 and a first end of the first sub-light emitting element SED1. For example, the first contact electrode 710 disposed in the first emission area EMA1 may contact the first end of the first type light emitting elements ED_B and the first end of the second type light emitting elements ED_G.

The second contact electrode 720 may extend in the second direction DR2 to contact a second end of the first main light emitting element MED1 and a second end of the first sub-light emitting element SED1. For example, the second contact electrode 720 disposed in the first emission area EMA1 may contact a second end of the first type light emitting elements ED_B and a second end of the second type light emitting elements ED_G. The first main light emitting element MED1 and the first sub-light emitting element SED1 may be electrically connected in parallel to each other. Accordingly, the first type light emitting elements ED_B and the second type light emitting elements ED_G disposed in the first emission area EMA1 may be electrically connected in parallel to each other.

The first wavelength conversion pattern WCL1 may be disposed on the first light emitting element ED1. Light emitted from the first light emitting element ED1 may be incident on the first wavelength conversion pattern WCL1 of the color control layer CWL from the light emitting element layer EML. For example, light emitted from the first main light emitting element MED1 including the first type light emitting elements ED_B and light emitted from the first sub-light emitting element SED1 including the second type light emitting elements ED_G, may be incident on the first wavelength conversion pattern WCL1. The wavelength of the light emitted from the first type light emitting elements ED_B and the second type light emitting elements ED_G and incident on the first wavelength conversion pattern WCL1, may be converted by the first wavelength conversion material WCP1.

The first color filter CF1 may be disposed on the first light emitting element ED1 and the first wavelength conversion pattern WCL1. The first color filter CF1 may selectively transmit light incident from the first wavelength conversion pattern WCL1.

Referring to FIGS. 3 and 7, the light emitting element layer EML of the second sub-pixel PX2 may include the second light emitting element ED2. The second light emitting element ED2 may be disposed in the second emission area EMA2. As described above, the second light emitting element ED2 may include the second main light emitting element MED2 including the first type light emitting elements ED_B and the second sub-light emitting element SED2 including the second type light emitting elements ED_G. The second main light emitting element MED2 and the second sub-light emitting element SED2 may be disposed on the same layer. For example, the second main light emitting element MED2 and the second sub-light emitting element SED2 may not overlap in the third direction DR3 and may overlap in a horizontal direction. Specifically, the second main light emitting element MED2 and the second sub-light emitting element SED2 may overlap each other in the second direction DR2.

Accordingly, the first type light emitting elements ED_B included in the second main light emitting element MED2 and the second type light emitting elements ED_G included in the second sub-light emitting element SED2 may be disposed on the same layer. Accordingly, the first type light emitting elements ED_B and the second type light emitting elements ED_G disposed in the second emission area EMA2 may not overlap in the third direction DR3 and may overlap each other in the second direction DR2.

The first contact electrode 710 may extend in the second direction DR2 to contact a first end of the second main light emitting element MED2 and a first end of the second sub-light emitting element SED2. For example, the first contact electrode 710 disposed in the second emission area EMA2 may contact a first end of the first type light emitting elements ED_B and a first end of the second type light emitting elements ED_G.

The second contact electrode 720 may extend in the second direction DR2 to contact a second end of the second main light emitting element MED2 and a second end of the second sub-light emitting element SED2. For example, the second contact electrode 720 disposed in the second emission area EMA2 may contact a second end of the first type light emitting elements ED_B and a second end of the second type light emitting elements ED_G. The second main light emitting element MED2 and the second sub-light emitting element SED2 may be electrically connected in parallel to each other. Accordingly, the first type light emitting elements ED_B and the second type light emitting elements ED_G disposed in the second emission area EMA2 may be electrically connected in parallel to each other.

The second wavelength conversion pattern WCL2 may be disposed on the second light emitting element ED2. Light emitted from the second light emitting element ED2 may be incident on the second wavelength conversion pattern WCL2 of the color control layer CWL from the light emitting element layer EML. For example, light emitted from the second main light emitting element MED2 including the first type light emitting elements ED_B and light emitted from the second sub-light emitting element SED2 including the second type light emitting elements ED_G may be incident on the second wavelength conversion pattern WCL2. The wavelength of the light emitted from the first type light emitting elements ED_B and the second type light emitting elements ED_G and incident on the second wavelength conversion pattern WCL2, may be converted by the second wavelength conversion material WCP2.

The second color filter CF2 may be disposed on the second light emitting element ED2 and the second wavelength conversion pattern WCL2. The second color filter CF2 may selectively transmit light incident from the second wavelength conversion pattern WCL2.

Referring to FIGS. 3 and 8, the light emitting element layer EML of the third sub-pixel PX3 may include the third light emitting element ED3. The third light emitting element ED3 may be disposed in the third emission area EMA3. As described above, the third light emitting element ED3 may include the first type light emitting elements ED_B. For example, the third sub-pixel PX3 may include a type of light emitting element ED.

The first contact electrode 710 may extend in the second direction DR2 to contact a first end of the first type light emitting elements ED_B disposed in the third emission area EMA3. The second contact electrode 720 may extend in the second direction DR2 to contact a second end of the first type light emitting elements ED_B disposed in the third emission area EMA3. Accordingly, the first type light emitting elements ED_B disposed in the third emission area EMA3 may be electrically connected in parallel with each other.

The light transmission pattern TPL1 may be disposed on the third light emitting element ED3. Light emitted from the third light emitting element ED3 may be incident on the light transmission pattern TPL1 of the color control layer CWL from the light emitting element layer EML. For example, light emitted from the first type light emitting elements ED_B may be incident on the light transmission pattern TPL1. Light emitted from the first type light emitting elements ED_B and incident on the light transmission pattern TPL1 may pass therethrough while maintaining the wavelength of the incident light.

The third color filter CF3 may be disposed on the third light emitting element ED3 and the light transmission pattern TPL1. The third color filter CF3 may selectively transmit light incident from the light transmission pattern TPL1.

Figure 9:
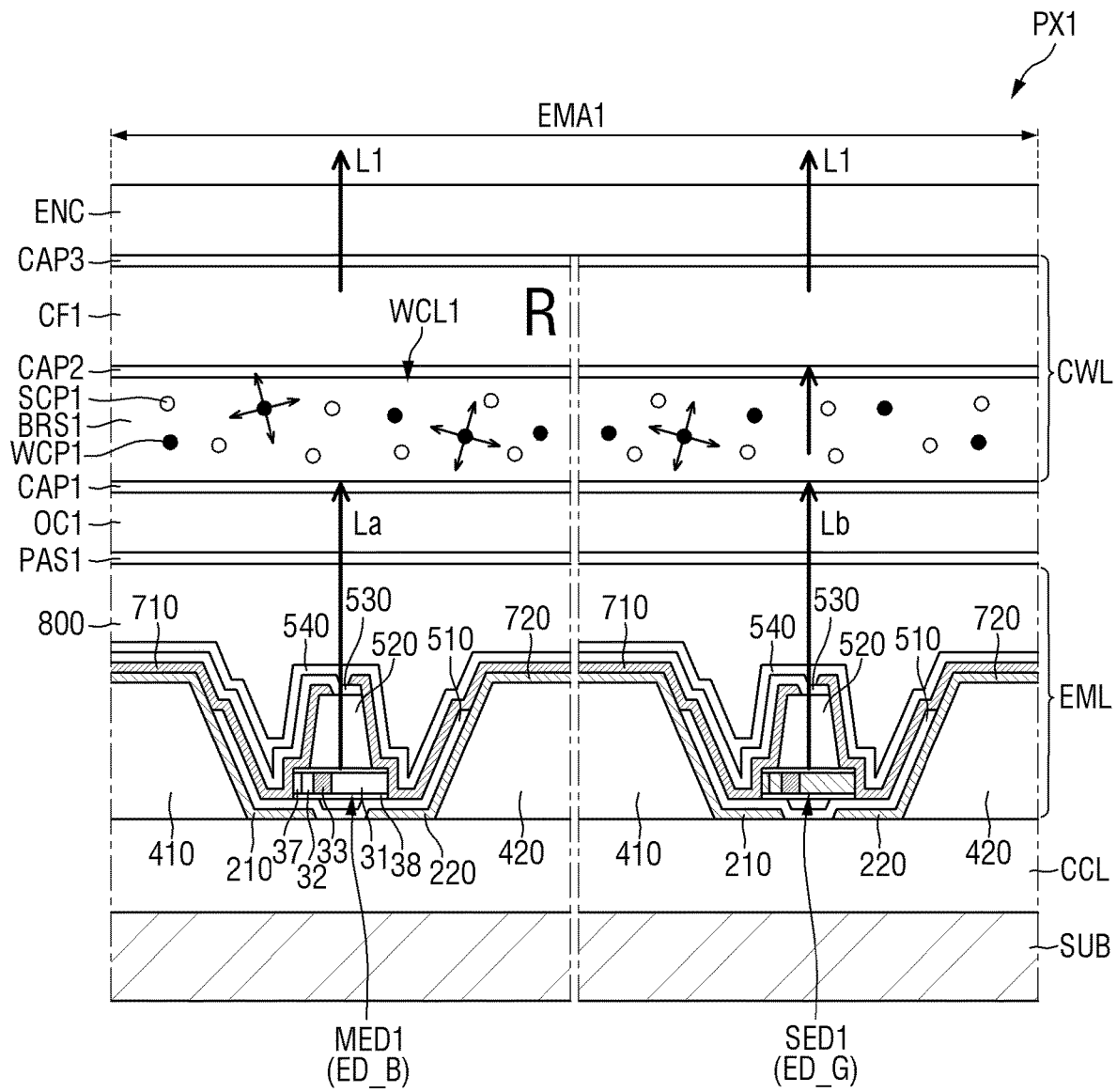
FIG. 9 is a schematic cross-sectional view illustrating a traveling path of light emitted from a first emission area of FIG. 6.
Figure 10:
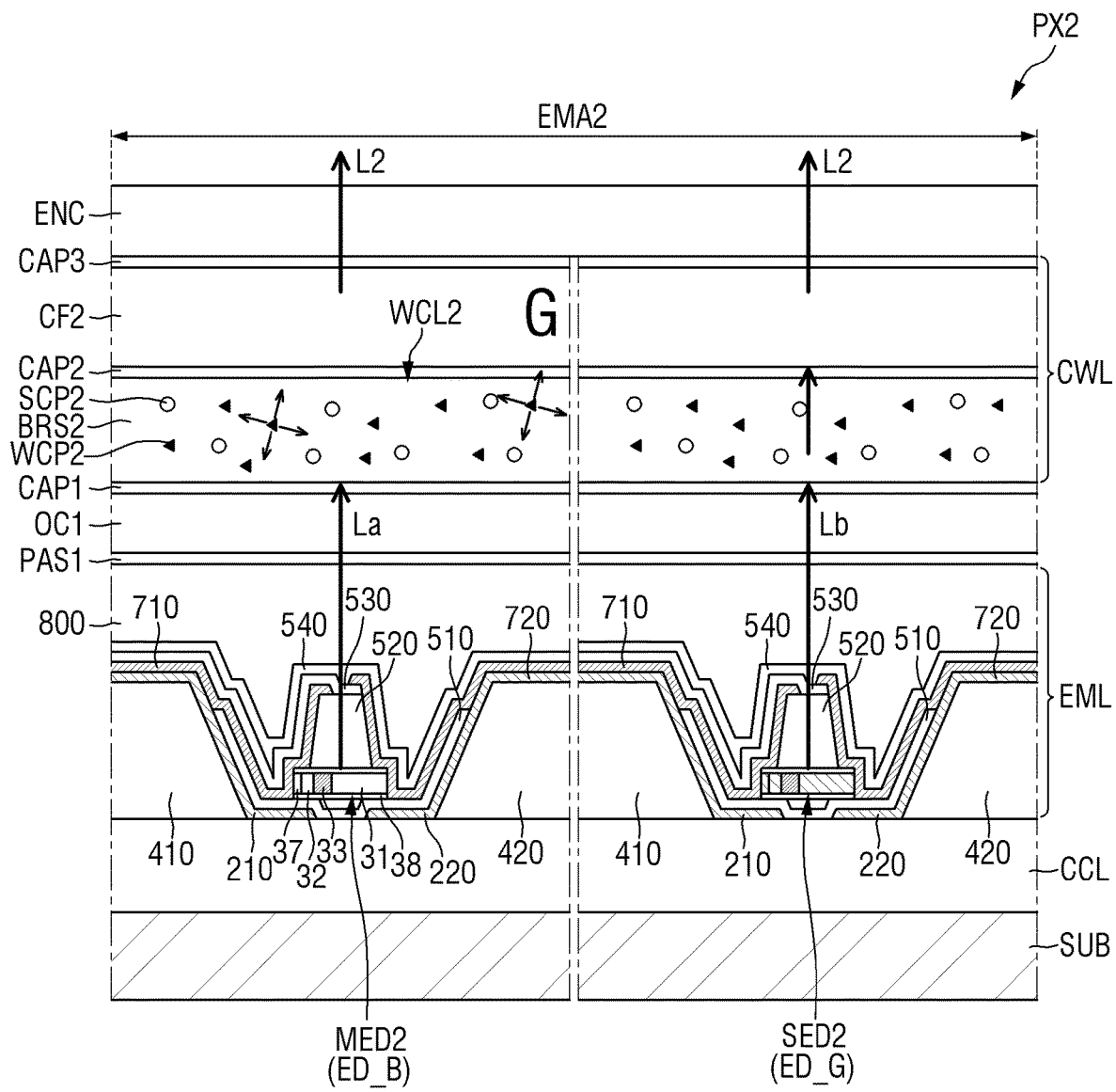
FIG. 10 is a schematic cross-sectional view illustrating a traveling path of light emitted from a second emission area of FIG. 7.
Figure 11:
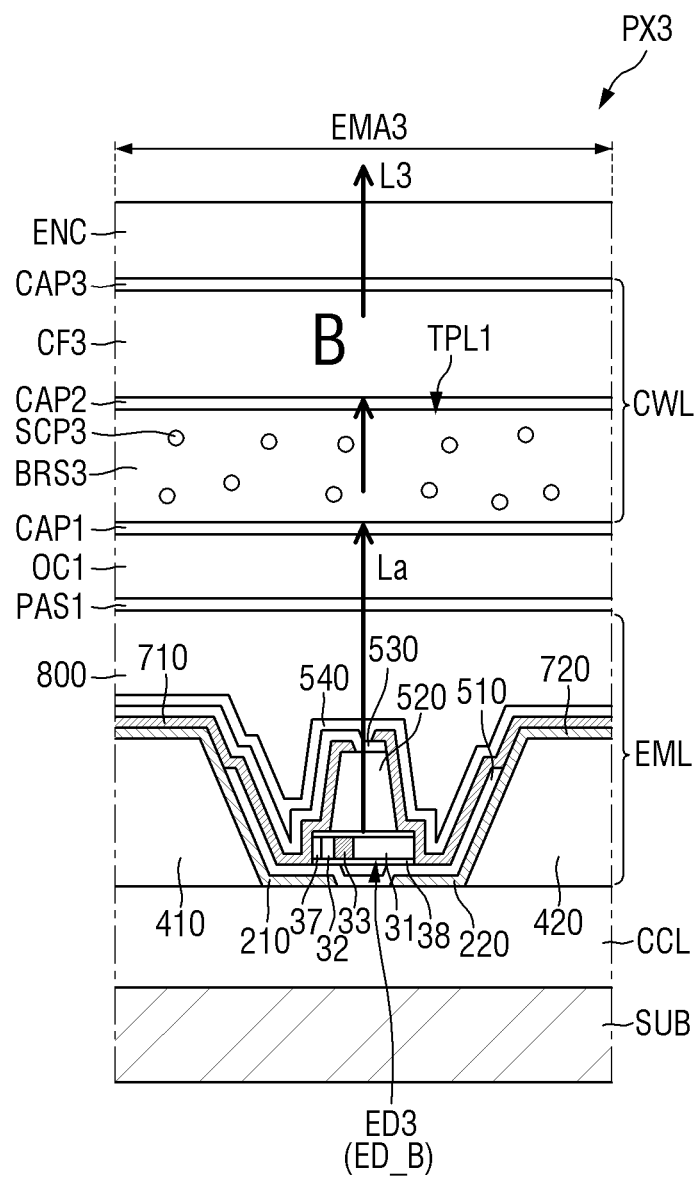
FIG. 11 is a schematic cross-sectional view illustrating a traveling path of light emitted from a third emission area of FIG. 8.

FIG. 9 is a schematic cross-sectional view illustrating a traveling path of light emitted from a first emission area of FIG. 6. FIG. 10 is a schematic cross-sectional view illustrating a traveling path of light emitted from a second emission area of FIG. 7. FIG. 11 is a schematic cross-sectional view illustrating a traveling path of light emitted from a third emission area of FIG. 8.

Referring to FIG. 9, light emitted from the first light emitting element ED1 disposed in the first emission area EMA1 may be incident on the color control layer CWL. The light incident on the color control layer CWL from the light emitting element layer EML in the first emission area EMA1 may include third color light La and second color light Lb. Specifically, the plurality of first type light emitting elements ED_B included in the first main light emitting element MED1 may emit the third color light La or blue light La (hereinafter, blue light La), and the second type light emitting elements ED_G included in the first sub-light emitting element SED1 may emit the second color light Lb or green light Lb (hereinafter, green light Lb). Accordingly, the light incident on the color control layer CWL from the light emitting element layer EML in the first emission area EMA1 of the first sub-pixel PX1 may include the blue light La and the green light Lb.

A part of the blue light La emitted from the first type light emitting elements ED_B and incident on the first wavelength conversion pattern WCL1 may be converted into red light by the first wavelength conversion material WCP1 of the first wavelength conversion pattern WCL1. On the other hand, in case that the blue light La emitted from the first type light emitting elements ED_B and incident on the first wavelength conversion material WCP1 of the first wavelength conversion pattern WCL1 undergoes the wavelength conversion (or light conversion) by the first wavelength conversion material WCP1, the traveling direction of the light may not be limited to a direction as illustrated in FIG. 9 and may have isotropic properties. In the specification, the phrase "the traveling direction of light may have isotropic properties" may mean that "the traveling direction of light may be random." Accordingly, a part of the blue light La, which has undergone the wavelength conversion (or light conversion) by the first wavelength conversion material WCP1, may not be incident on the first color filter CF1, but may be incident on the light emitting element layer EML. Accordingly, a ratio of light incident on the first color filter CF1 from the first wavelength conversion pattern WCL1 may be reduced because of the light conversion by the first wavelength conversion material WCP1.

A part of the green light Lb emitted from the second type light emitting elements ED_G and incident on the first wavelength conversion pattern WCL1 may be converted into red light by the first wavelength conversion material WCP1 of the first wavelength conversion pattern WCL1. On the other hand, in case that the green light Lb emitted from the second type light emitting elements ED_G and incident on the first wavelength conversion material WCP1 of the first wavelength conversion pattern WCL1 undergoes wavelength conversion (or light conversion) by the first wavelength conversion material WCP1, the traveling direction of the light may have isotropic properties as described above, and thus a part of the green light Lb, which has undergone the wavelength conversion (or light conversion) by the first wavelength conversion material WCP1, may not be incident on the first color filter CF1, but may be incident on the light emitting element layer EML.

On the other hand, the light conversion efficiency of the blue light La with respect to the first wavelength conversion material WCP1 may be greater than the light conversion efficiency of the green light Lb with respect to the first wavelength conversion material WCP1. Accordingly, the straightness of the blue light La having high light conversion efficiency may be reduced because of the isotropic property of light by the light conversion. In the embodiment, the first main light emitting element MED1 of the first light emitting element ED1 disposed in the first emission area EMA1 of the first sub-pixel PX1 may be constituted with the first type light emitting elements ED_B that emit the blue light La having high light conversion efficiency, and the first sub-light emitting element SED1 of the first light emitting element ED1 may be constituted with the second type light emitting elements ED_G that emit the green light Lb having the relatively low light conversion efficiency compared to the blue light La but having high straightness of light. Accordingly, the light conversion efficiency of the display device 10 may be maintained, and the front surface luminance of the display device 10 may be improved.

The blue light La and the green light Lb incident on the first wavelength conversion pattern WCL1 from the light emitting element layer EML may be converted into red light by the first wavelength conversion pattern WCL1 to pass through the first color filter CF1, and red light L1 that has passed through the first color filter CF1 may be emitted to the outside of the display device 10.

Referring to FIG. 10, light emitted from the second light emitting element ED2 disposed in the second emission area EMA2 may be incident on the color control layer CWL. The light incident on the color control layer CWL from the light emitting element layer EML in the second emission area EMA2 may include the third color light La and the second color light Lb. Specifically, the plurality of first type light emitting elements ED_B included in the second main light emitting element MED2 may emit the blue light La, and the second type light emitting element ED_G included in the second sub-light emitting element SED2 may emit the green light Lb. Accordingly, the light incident on the color control layer CWL from the light emitting element layer EML in the second emission area EMA2 of the second sub-pixel PX2 may include the blue light La and the green light Lb.

A part of the blue light La emitted from the first type light emitting elements ED_B and incident on the second wavelength conversion pattern WCL2, may be converted into green light by the second wavelength conversion material WCP2 of the second wavelength conversion pattern WCL2. On the other hand, in case that the blue light La emitted from the first type light emitting elements ED_B and incident on the second wavelength conversion material WCP2 of the second wavelength conversion pattern WCL2 undergoes the light conversion by the second wavelength conversion material WCP2, the light may have isotropic properties as described above. Accordingly, a part of the blue light La, which has undergone the light conversion by the second wavelength conversion material WCP2, may not be incident on the second color filter CF2, but may be incident on the light emitting element layer EML. Accordingly, a ratio of light incident on the second color filter CF2 from the second wavelength conversion pattern WCL2 may be reduced because of the light conversion by the second wavelength conversion material WCP2.

The green light Lb emitted from the second type light emitting elements ED_G and incident on the second wavelength conversion pattern WCL2 may not undergo the wavelength conversion by the second wavelength conversion material WCP2, may pass therethrough, and may be incident on the second color filter CF2. Accordingly, the green light Lb emitted from the second type light emitting element ED_G in the second emission area EMA2 may have relatively excellent straightness compared to the blue light La. Accordingly, straightness of the light that emits from the second light emitting element ED2, passes through the second wavelength conversion pattern WCL2, and is incident on the second color filter CF2, may be improved.

The blue light La incident on the second wavelength conversion pattern WCL2 from the light emitting element layer EML, may be converted into red light by the second wavelength conversion pattern WCL2 to pass through the second color filter CF2, and the green light Lb may pass through the second wavelength conversion pattern WCL2 to pass through the second color filter CF2. The green light L2 that has passed through the second color filter CF2 may be emitted to the outside of the display device 10. Accordingly, since the second light emitting element ED2 includes the second type light emitting element ED_G having excellent straightness, the front surface luminance of the display device 10 may be improved.

Referring to FIG. 11, light emitted from the third light emitting element ED3 disposed in the third emission area EMA3 may be incident on the color control layer CWL. The light incident on the color control layer CWL from the light emitting element layer EML in the third emission area EMA3 may include the third color light La. Specifically, the first type light emitting elements ED_B included in the third light emitting element ED3 may emit the blue light La. Accordingly, the light incident on the color control layer CWL from the light emitting element layer EML in the third emission area EMA3 of the third sub-pixel PX3 may include the blue light La.

The blue light La emitted from the first type light emitting elements ED_B and incident on the light transmission pattern TPL1 may not undergo wavelength conversion, may pass therethrough, and may be incident on the third color filter CF3. The blue light L3 that has passed through the third color filter CF3 may be emitted to the outside of the display device 10.

In the display device 10 according to the embodiment, each of the first light emitting element ED1 included in the first sub-pixel PX1 and the second light emitting element ED2 included in the second sub-pixel PX2 may be configured such that the main light emitting element is constituted with the first type light emitting element ED_B that emits the blue light having excellent light conversion efficiency, and the sub-light emitting element is constituted with the second type light emitting element ED_G that emits green light having a low light conversion efficiency compared to the blue light but a desirable straightness of light with respect to the wavelength conversion pattern. The main light emitting element is constituted with the first type light emitting element ED_B that emits the blue light, and the sub-light emitting element is constituted with the second type light emitting element ED_G that emits green light, so that the light conversion efficiency may be maintained and the straightness of light may be improved. Therefore, the front surface luminance of the display device 10 may be improved.

Figure 12:
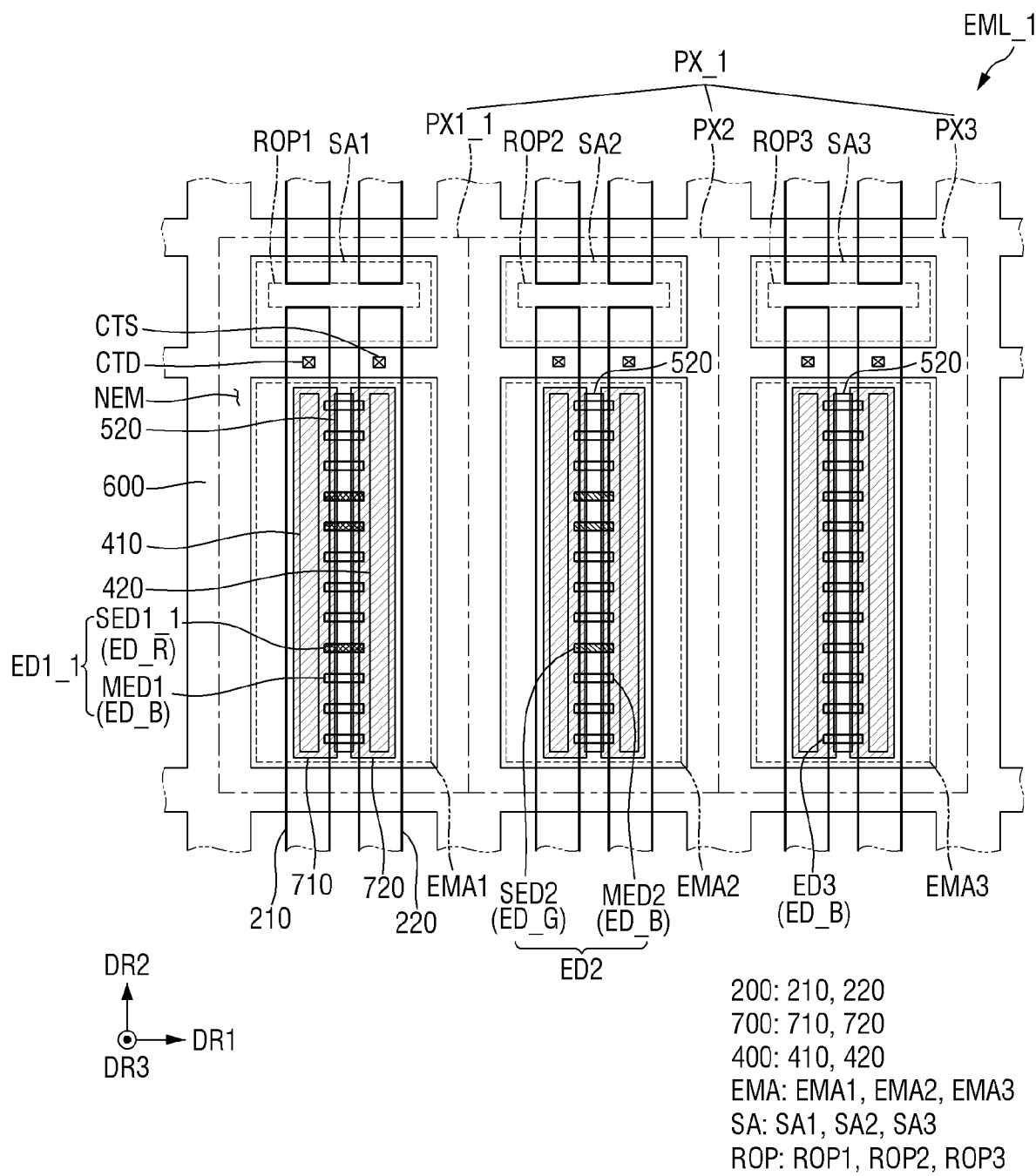
FIG. 12 is a schematic plan layout view of a light emitting element layer according to another embodiment.
Figure 13:
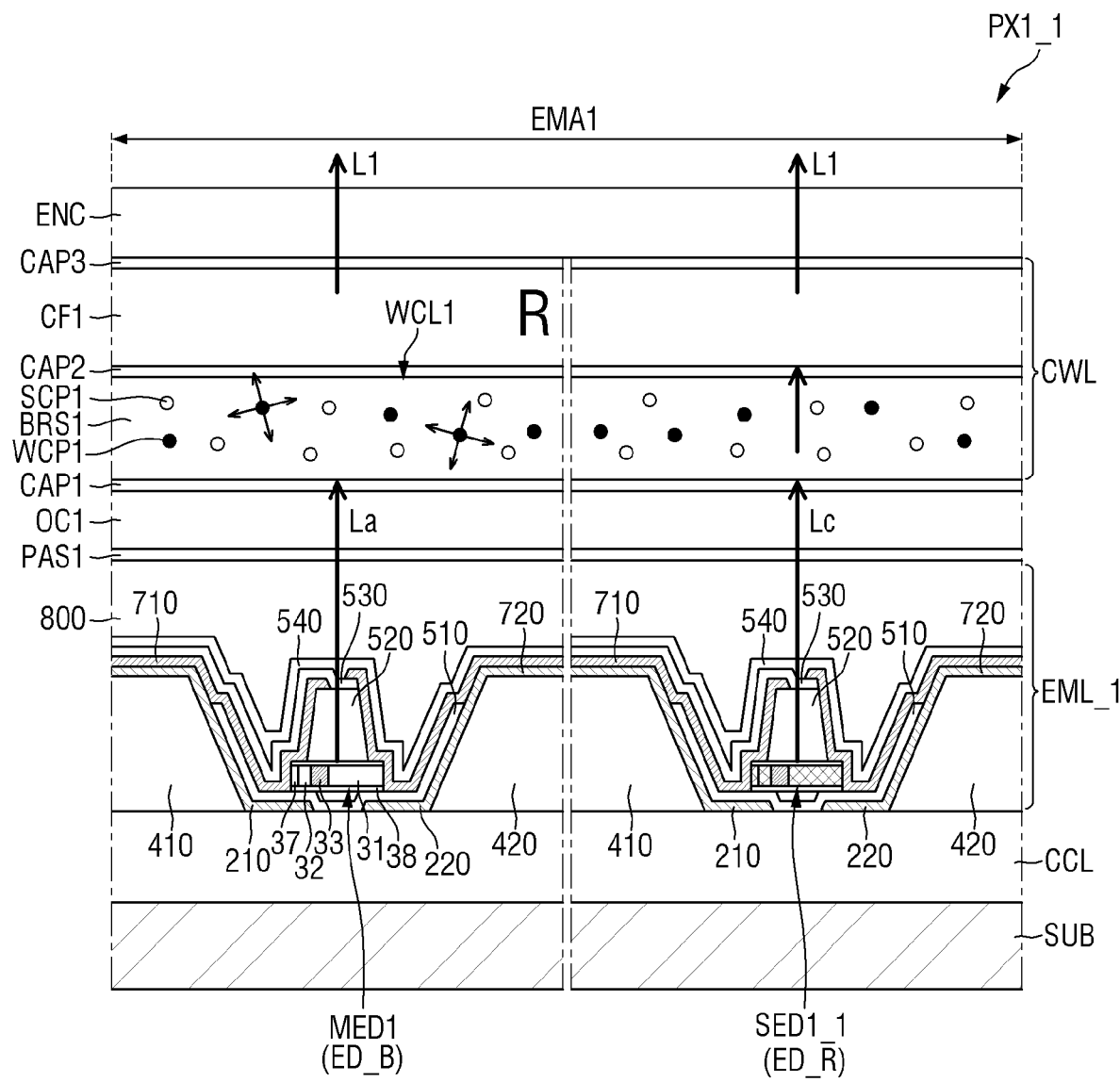
FIG. 13 is a schematic cross-sectional view illustrating an example of a first emission area of a first sub-pixel included in the display device of FIG. 12.

FIG. 12 is a schematic plan layout view of a light emitting element layer according to another embodiment. FIG. 13 is a schematic cross-sectional view illustrating an example of a first emission area of a first sub-pixel included in the display device of FIG. 12.

Referring to FIGS. 12 and 13, a first light emitting element ED1_1 included in a first sub-pixel PX1_1 of a pixel PX_1 of the display device 10 according to another embodiment includes the first main light emitting element MED1 including the first type light emitting elements ED_B and a first sub-light emitting element SED1_1 including the third type light emitting elements ED_R, which is the difference from the embodiment of FIG. 4.

The first to third light emitting elements ED1_1, ED2, and ED3 included in a light emitting element layer EML_1 of the first to third sub-pixels PX1_1, PX2, and PX3 may be constituted with different types of light emitting elements ED.

The first light emitting element ED1_1 included in the first sub-pixel PX1_1 for emission of red light may be constituted with the first type light emitting element ED_B and the third type light emitting element ED_R. Specifically, the first main light emitting element MED1 according to the embodiment may include the first type light emitting elements ED_B emitting light of the third color different from the first color, and the first sub-light emitting element SED1_1 may include the third type light emitting elements ED_R emitting light of the first color that is the same as the first color. For example, the first main light emitting element MED1 may include the first type light emitting elements ED_B emitting light of the blue color different from the red color exhibited by the first sub-pixel PX1_1, and the first sub-light emitting element SED1_1 may include the third type light emitting elements ED_R emitting light of the red color that is the same as the red color exhibited by the first sub-pixel PX1_1 and different from the blue color emitted by the first type light emitting element ED_B.

The second light emitting element ED2 included in the second sub-pixel PX2 for emission of green light may be constituted with types of light emitting elements ED different from the configuration included in the first light emitting element ED1_1. As described above, the second light emitting element ED2 may include the second main light emitting element MED2 including the first type light emitting elements ED_B and the second sub-light emitting element SED2 including the second type light emitting elements ED_G.

The third light emitting element ED3 included in the third sub-pixel PX3 for emission of blue light may include the first type light emitting elements ED_B.

The first main light emitting element MED1 including the first type light emitting elements ED_B and the first sub-light emitting element SED1_1 including the third type light emitting elements ED_R may be disposed on the same layer. Accordingly, the first main light emitting element MED1 and the first sub-light emitting element SED1_1 may not overlap in the third direction DR3.

Referring to FIG. 13, light La and Lc emitted from the light emitting element layer EML_1 of the first sub-pixel PX1_1 and incident on the color control layer CWL may include the blue light La and the red light Lc. Specifically, the blue light La emitted from the first type light emitting element ED_B and the red light Lc emitted from the third type light emitting element ED_R may be incident on the first wavelength conversion pattern WCL1 of the color control layer CWL. A part of the blue light La emitted from the first type light emitting element ED_B and incident on the first wavelength conversion pattern WCL1, may be converted into red light by the first wavelength conversion material WCP1 and may pass through the first color filter CF1 disposed thereabove. The red light L1 that has passed through the first color filter CF1 may be emitted to the outside of the display device 10. The red light Lc emitted from the third type light emitting element ED_R and incident on the first wavelength conversion pattern WCL1, may pass through the first wavelength conversion material WCP1 and pass through the first color filter CF1 disposed thereabove. The red light L1 that has passed through the first color filter CF1 may be emitted to the outside of the display device 10.

In the embodiment, the first light emitting element ED1_1 may be configured for the first sub-light emitting element SED1_1 to include the third type light emitting elements ED_R, so that the red light Lc emitted from the third type light emitting element ED_R may pass therethrough without undergoing the wavelength conversion by the first wavelength conversion material WCP1 and may be incident on the first color filter CF1. Accordingly, the red light Lc emitted from the third type light emitting element ED_R may have relatively excellent straightness compared to the blue light La. Accordingly, straightness of the light that is emitted from the first light emitting element ED1_1, passes through the first wavelength conversion pattern WCL1, and is incident on the first color filter CF1, may be improved. Accordingly, since the first light emitting element ED1_1 includes the third type light emitting element ED_R having excellent straightness, the front surface luminance of the display device 10 may be improved.

Figure 14:
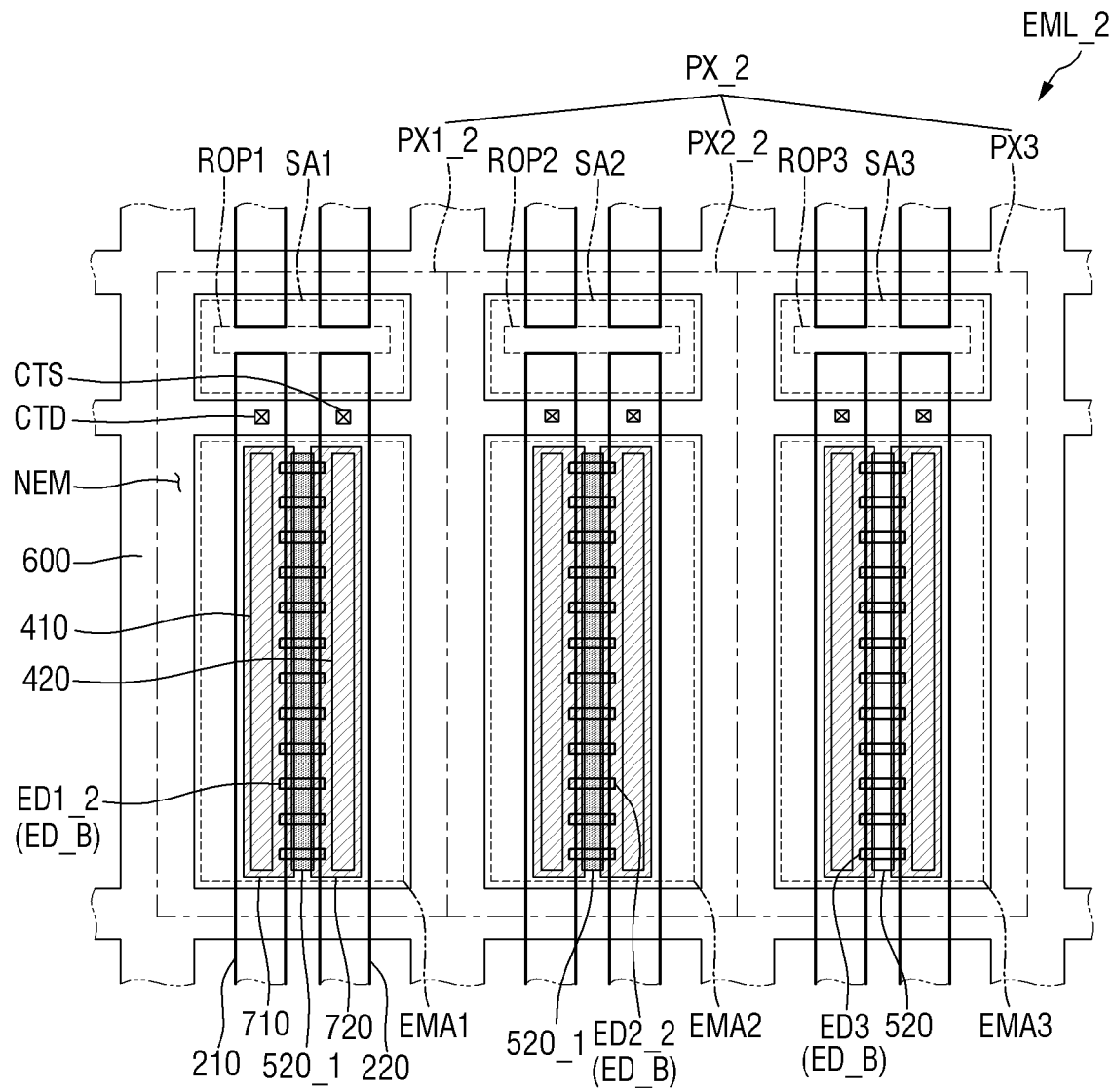
FIG. 14 is a schematic plan layout view of a light emitting element layer according to still another embodiment.
Figure 15:
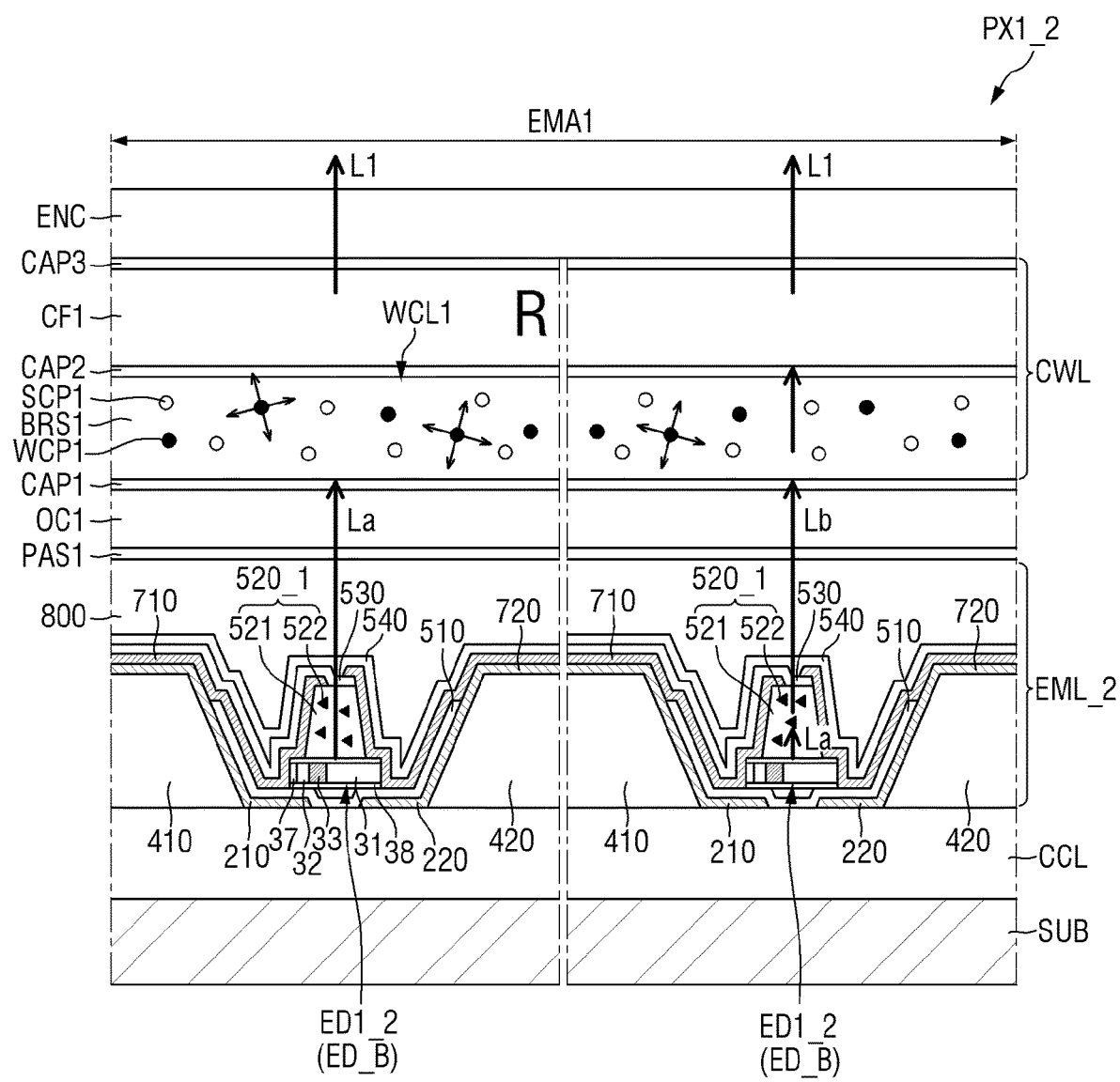
FIG. 15 is a schematic cross-sectional view showing an example of a first emission area of a first sub-pixel included in the display device of FIG. 14.
Figure 16:
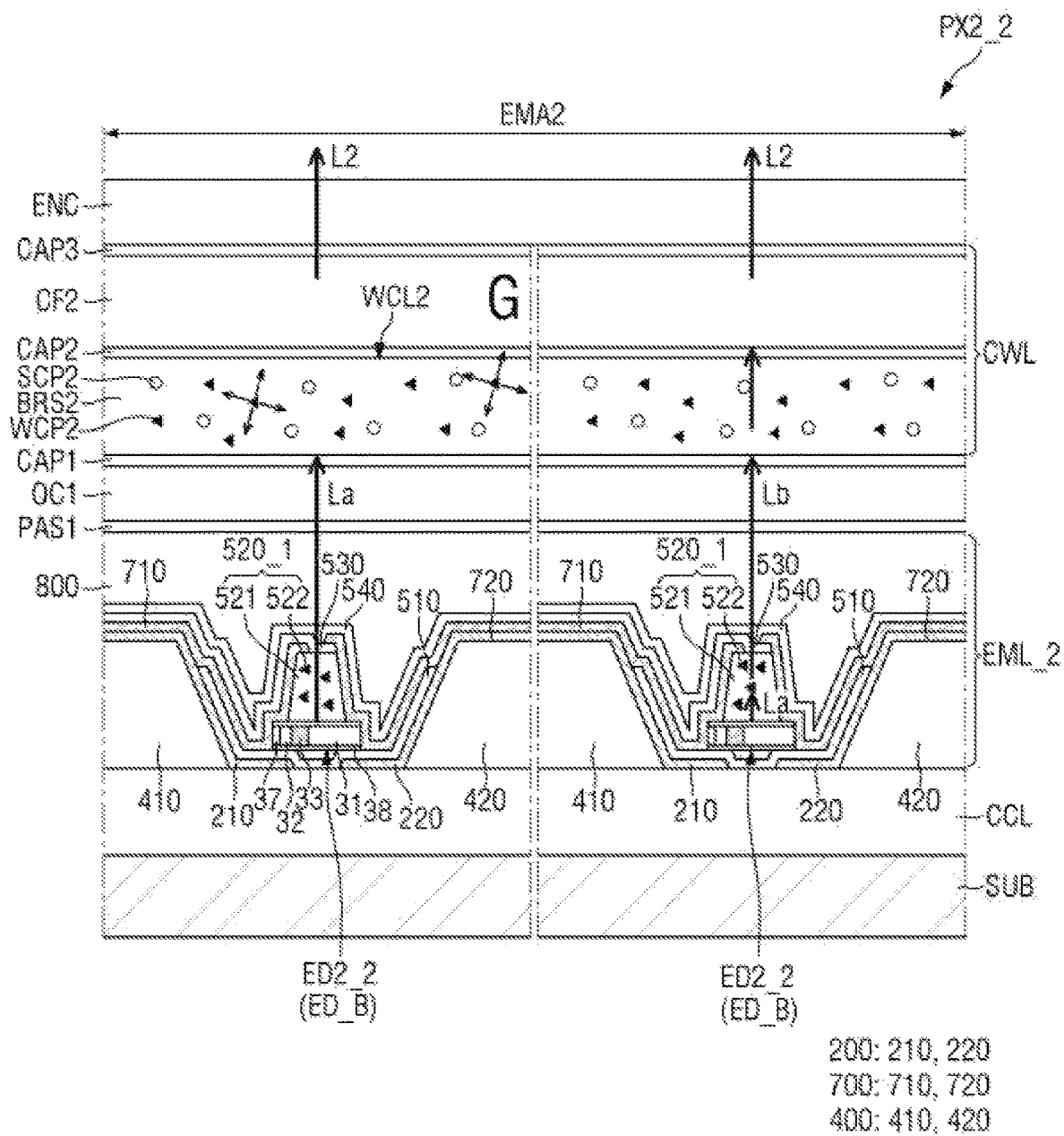
FIG. 16 is a schematic cross-sectional view showing an example of a second emission area of a second sub-pixel included in the display device of FIG. 14.

FIG. 14 is a schematic plan layout view of a light emitting element layer according to still another embodiment. FIG. 15 is a schematic cross-sectional view illustrating an example of a first emission area of a first sub-pixel included in the display device of FIG. 14. FIG. 16 is a schematic cross-sectional view illustrating an example of a second emission area of a second sub-pixel included in the display device of FIG. 14.

Referring to FIGS. 14 to 16, a first sub-pixel PX1_2 and a second sub-pixel PX2_2 of a pixel PX_2 of the display device 10 according to the embodiment includes the first type light emitting element ED_B that is one type of light emitting element ED, and a second insulating layer 520_1 includes first lower wavelength conversion particles 522, which are different from the embodiments of FIGS. 4, 6, and 7.

The first to third sub-pixels PX1_2, PX2_2, and PX3 may include a same type of light emitting element ED. Each of the first to third sub-pixels PX1_2, PX2_2, and PX3 may include the first type light emitting element ED_B.

The second insulating layer 520_1 of the first sub-pixel PX1_2 and the second sub-pixel PX2_2 may include a base layer 521 and the first lower wavelength conversion particles 522 dispersed in the base layer 521. The third sub-pixel PX3 may include the second insulating layer 520 described above, unlike the first sub-pixel PX1_2 and the second sub-pixel PX2_2. For example, the second insulating layer 520 included in the third sub-pixel PX3 may not include wavelength conversion particles.

The second insulating layer 520_1 may be disposed on each of a first light emitting element ED1_2 disposed in the first sub-pixel PX1_2 and a second light emitting element ED2_2 disposed in the second sub-pixel PX2_2. The second insulating layer 520_1 may include the base layer 521 and the first lower wavelength conversion particles 522 dispersed in the base layer 521. The base layer 521 and the second insulating layer 520 may have substantially the same material and/or structure.

The first lower wavelength conversion particle 522 may be a material that converts the third color light into the second color light. For example, the first lower wavelength conversion particle 522 may be a material that converts blue light into green light. The first lower wavelength conversion particle 522 may be a quantum dot, a quantum rod, a phosphor, or the like. Examples of the quantum dot may include group IV nanocrystal, group II-VI compound nanocrystal, group III-V compound nanocrystal, group IV-VI nanocrystal, and a combination thereof.

As illustrated in FIG. 15, the light La and Lb emitted from a light emitting element layer EML_2 of the first sub-pixel PX1_2 and incident on the color control layer CWL, may include the blue light La and the green light Lb. Specifically, a part of the blue light La emitted from the first type light emitting element ED_B may be incident on the first wavelength conversion pattern WCL1. A part of the blue light La emitted from the first type light emitting element ED_B and incident on the first wavelength conversion pattern WCL1, may be converted into red light by the first wavelength conversion material WCP1, and may pass through the first color filter CF1 disposed thereabove.

Another part of the blue light La emitted from the first type light emitting element ED_B may be incident on the second insulating layer 520_1 and may be converted into the green light Lb by the first lower wavelength conversion particle 522. A part of the green light Lb emitted from the light emitting element layer EML_2 and incident on the first wavelength conversion pattern WCL1 may be converted into red light by the first wavelength conversion material WCP1, and may pass through the first color filter CF1 disposed thereabove.

The blue light La and the green light Lb incident on the first wavelength conversion pattern WCL1 from the light emitting element layer EML_2 may be converted into red light by the first wavelength conversion pattern WCL1 to pass through the first color filter CF1, and the red light L1 that has passed through the first color filter CF1 may be emitted to the outside of the display device 10.

As illustrated in FIG. 16, the light La and Lb emitted from the light emitting element layer EML_2 of the second sub-pixel PX2_2 and incident on the color control layer CWL may include the blue light La and the green light Lb. Specifically, a part of the blue light La emitted from the first type light emitting element ED_B may be incident on the second wavelength conversion pattern WCL2. A part of the blue light La emitted from the first type light emitting element ED_B and incident on the second wavelength conversion pattern WCL2, may be converted into green light by the second wavelength conversion material WCP2 and may pass through the second color filter CF2 disposed thereabove.

Another part of the blue light La emitted from the first type light emitting element ED_B may be incident on the second insulating layer 520_1 and may be converted into the green light Lb by the first lower wavelength conversion particle 522. A part of the green light Lb emitted from the light emitting element layer EML_2 and incident on the second wavelength conversion pattern WCL2 may pass through the second wavelength conversion pattern WCL2 and the second color filter CF2 disposed on the second wavelength conversion pattern WCL2.

Each of the blue light La and the green light Lb incident on the second wavelength conversion pattern WCL2 from the light emitting element layer EML_2, may be converted into green light by the second wavelength conversion pattern WCL2 or pass therethrough to be incident on the second color filter CF2, and the green light Lb incident on the second color filter CF2 may pass through the second color filter CF2 to be emitted to the outside of the display device 10 as the green light L2.

In the embodiment, although only the first type light emitting element ED_B emitting blue light is disposed in each of the first sub-pixel PX1_2 and the second sub-pixel PX2_2, the second insulating layer 520_1 includes the first lower wavelength conversion particles 522, so that the light emitted from a light emitting element layer EML_2 of the first sub-pixel PX1_2 and the second sub-pixel PX2_2 may include the blue light La and the green light Lb. Accordingly, although the first sub-pixel PX1_2 and the second sub-pixel PX2_2 include only the first type light emitting element ED_B having a high wavelength conversion efficiency but a relatively small straightness of light, the wavelength conversion particles are included in the second insulating layer 520_1, so that the light emitted from the light emitting element layer EML_2 may include the blue light La having a high wavelength conversion efficiency but a relatively small straightness of light and the green light Lb having a high straightness of light. Accordingly, as described above, the display device 10 with improved front surface luminance may be provided. In addition, since only light emitting elements of the same type are disposed in each sub-pixel PXn, a process of aligning the light emitting elements ED during the manufacturing process of the display device 10 may be facilitated.

Figure 17:
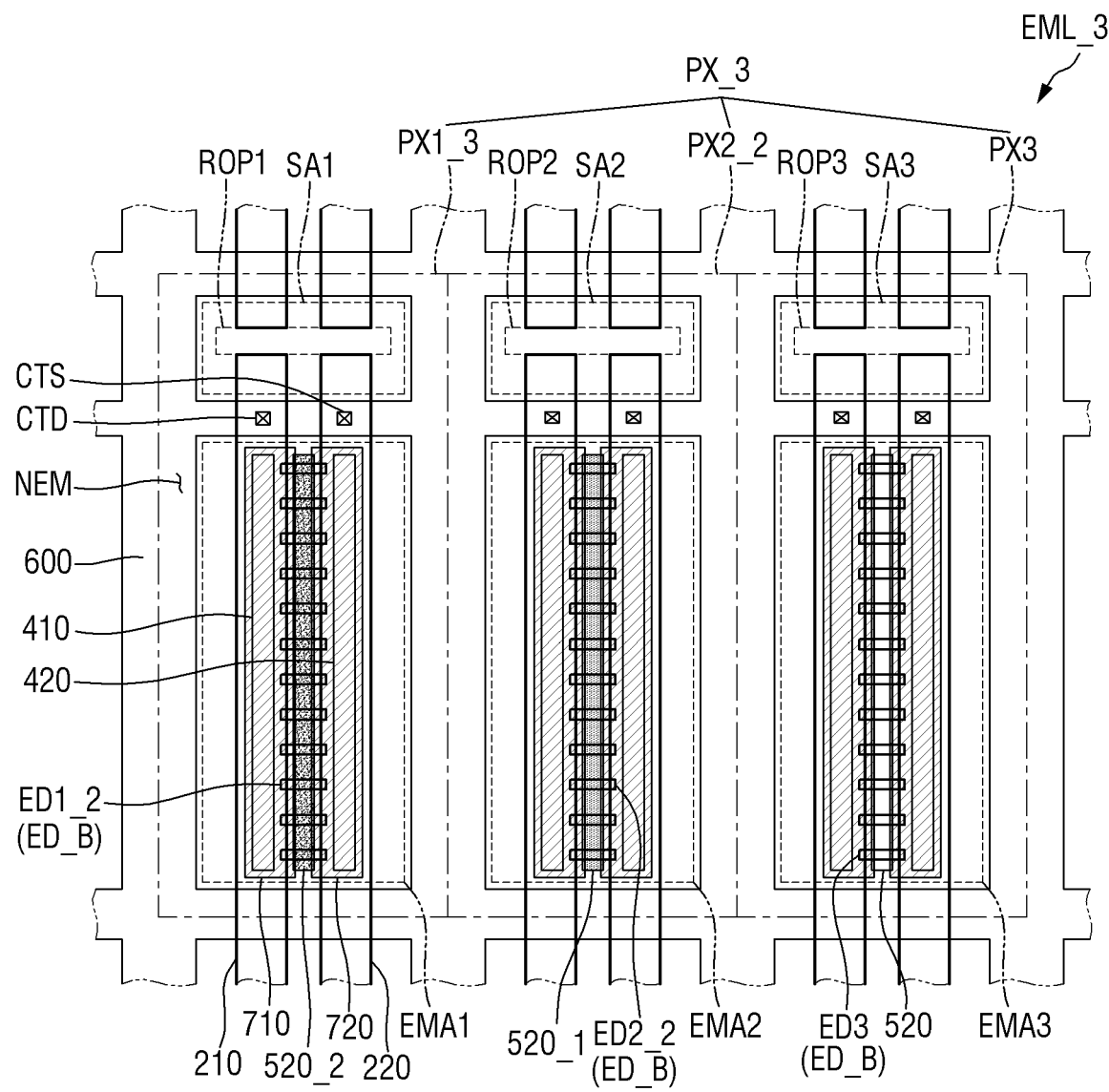
FIG. 17 is a schematic plan layout view of a light emitting element layer according to still another embodiment.
Figure 18:
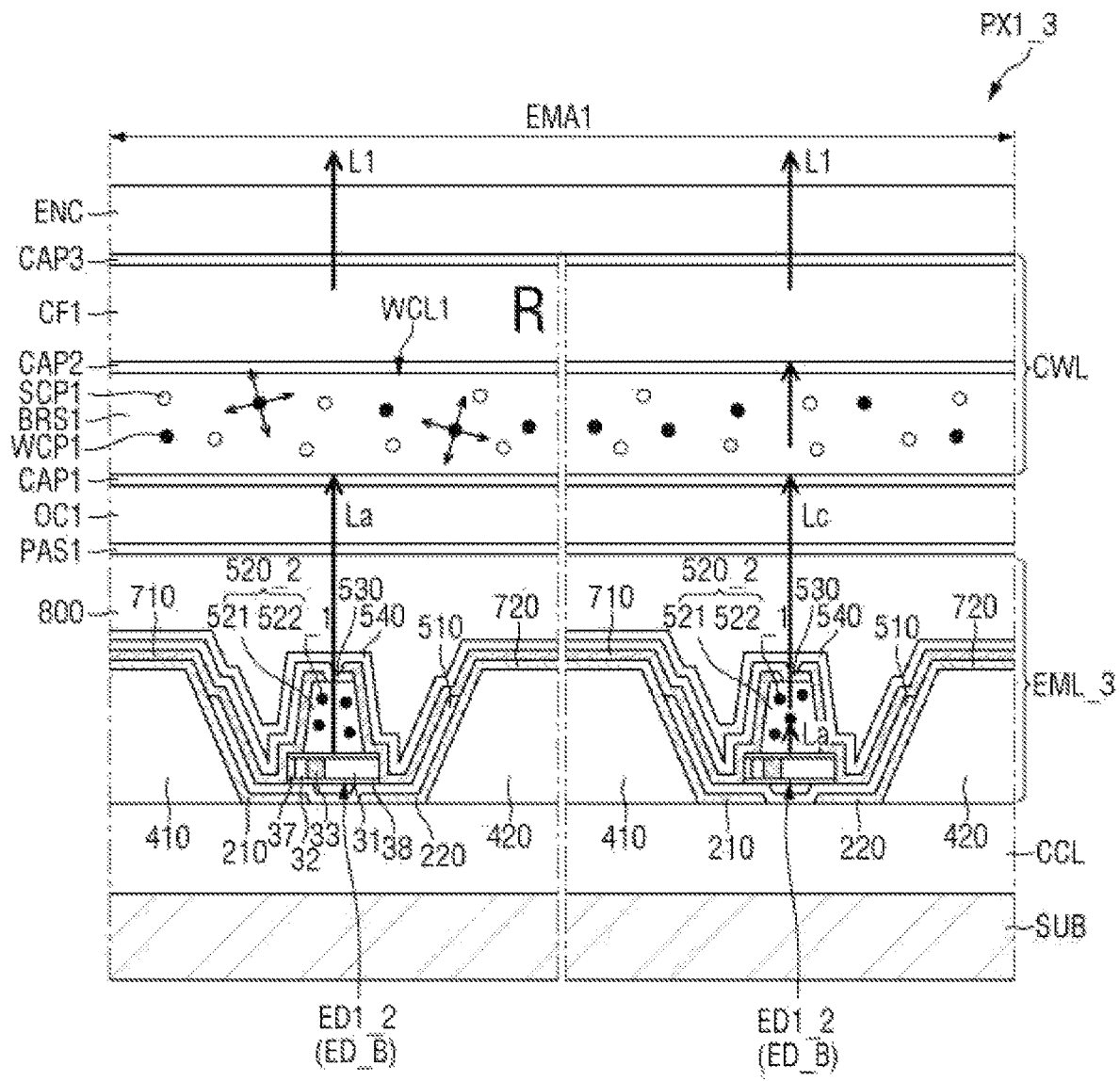
FIG. 18 is a schematic cross-sectional view showing an example of a first emission area of a first sub-pixel included in the display device of FIG. 17.

FIG. 17 is a schematic plan layout view of a light emitting element layer according to still another embodiment. FIG. 18 is a schematic cross-sectional view illustrating an example of a first emission area of a first sub-pixel included in the display device of FIG. 17.

Referring to FIGS. 17 and 18, a second insulating layer 520_2 disposed in a first sub-pixel PX1_3 of a pixel PX_3 of the display device 10 according to the embodiment includes second lower wavelength conversion particles 522_1 different from the first lower wavelength conversion particles 522, which is the difference from the embodiment of FIGS. 14 and 15.

The second insulating layer 520_2 disposed in the first sub-pixel PX1_3 of the display device 10 according to the embodiment may include the base layer 521 and the second lower wavelength conversion particles 522_1. The second insulating layer 520_1 disposed in the second sub-pixel PX2_2 may include the base layer 521 and the first lower wavelength conversion particles 522. The second insulating layer 520 disposed in the third sub-pixel PX3 may not include wavelength conversion particles. For example, the second insulating layer disposed in each of the first to third sub-pixels PX1_3, PX2_2, and PX3 may include the same wavelength conversion particle or wavelength conversion particles different from each other.

The first sub-pixel PX1_3 may include the second insulating layer 520_2 including the base layer 521 and the second lower wavelength conversion particles 522_1 dispersed in the base layer 521. The second lower wavelength conversion particle 522_1 may include a material different from the first lower wavelength conversion particle 522. The second lower wavelength conversion particle 522_1 may be a material that converts the third color light into the first color light. For example, the second lower wavelength conversion particle 522_1 may be a material that converts blue light into red light. The second lower wavelength conversion particle 522_1 may be a quantum dot, a quantum rod, a phosphor, or the like. Examples of the quantum dot may include group IV nanocrystal, group II-VI compound nanocrystal, group III-V compound nanocrystal, group IV-VI nanocrystal, and a combination thereof.

As illustrated in FIG. 18, the light La and Lc emitted from a light emitting element layer EML_3 of the first sub-pixel PX1_3 and incident on the color control layer CWL, may include the blue light La and the red light Lc. Specifically, a part of the blue light La emitted from the first type light emitting element ED_B may be incident on the first wavelength conversion pattern WCL1. A part of the blue light La emitted from the first type light emitting element ED_B and incident on the first wavelength conversion pattern WCL1, may be converted into red light by the first wavelength conversion material WCP1 and may pass through the first color filter CF1 disposed thereabove.

Another part of the blue light La emitted from the first type light emitting element ED_B may be incident on the second insulating layer 520_2 and may be converted into the red light Lc by the second lower wavelength conversion particle 522_1. A part of the red light Lc emitted from the light emitting element layer EML_3 and incident on the first wavelength conversion pattern WCL1, may pass through the first wavelength conversion pattern WCL1 and the first color filter CF1 disposed above the first wavelength conversion pattern WCL1.

Each of the blue light La and the red light Lc incident on the first wavelength conversion pattern WCL1 from the light emitting element layer EML_3, may be converted into red light by the first wavelength conversion pattern WCL1 or pass therethrough to be incident on the first color filter CF1, and the red light incident on the first color filter CF1 may pass through the first color filter CF1 to be emitted to the outside of the display device 10 as the red light L1.

Figure 19:
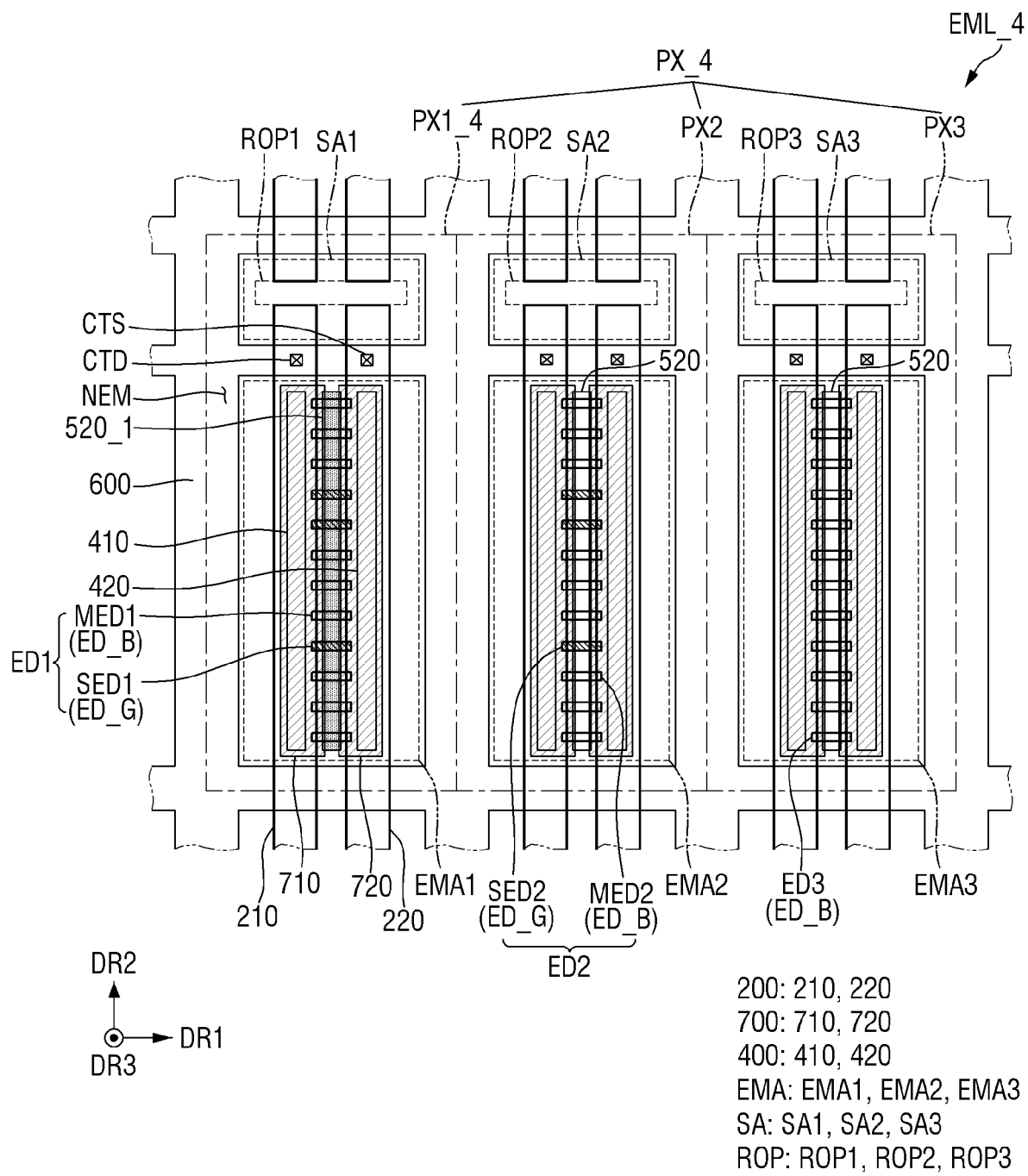
FIG. 19 is a schematic plan layout view of a light emitting element layer according to still another embodiment.
Figure 20:
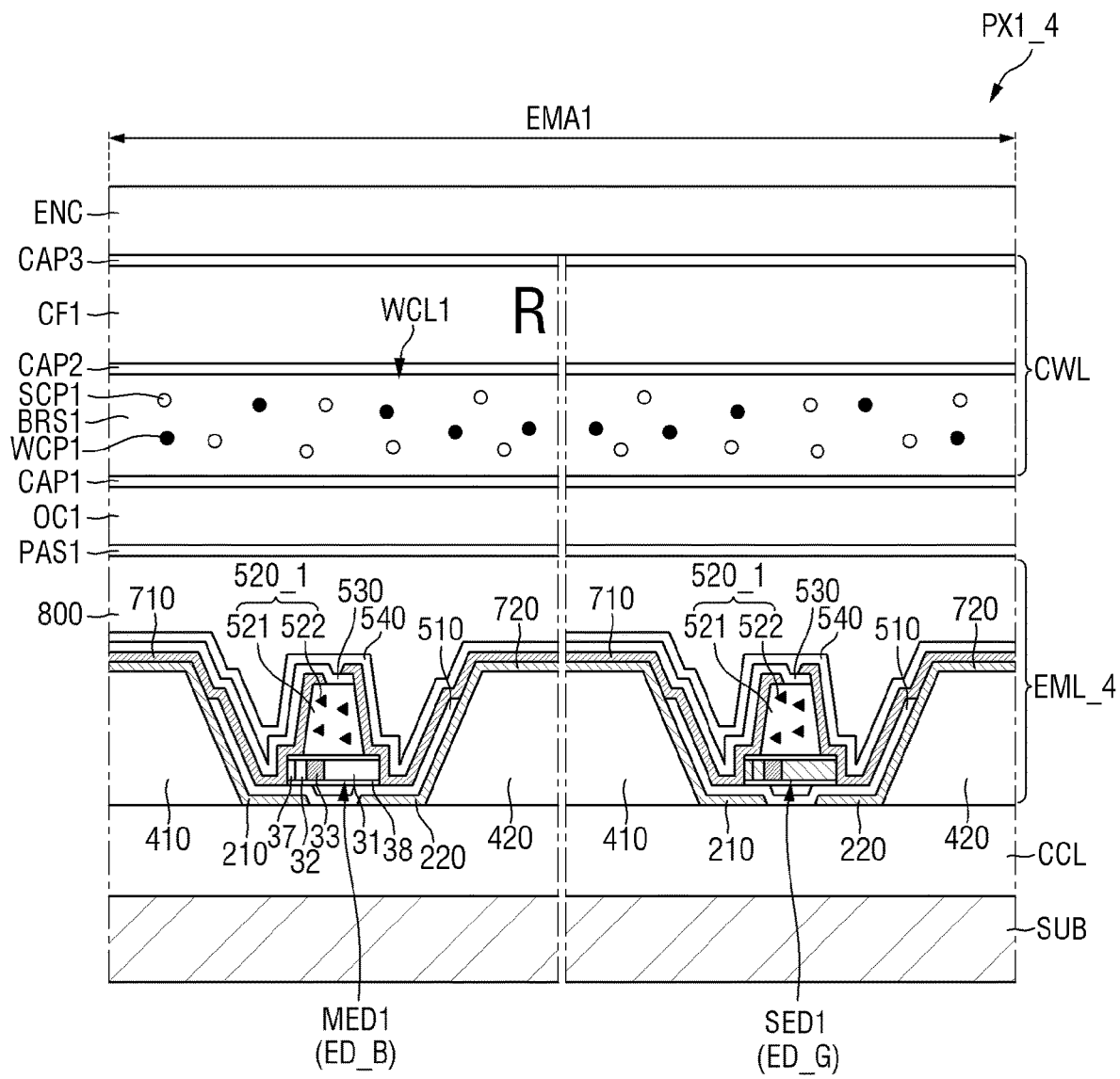
FIG. 20 is a schematic cross-sectional view showing an example of a first emission area of a first sub-pixel included in the display device of FIG. 19.

FIG. 19 is a schematic plan layout view of a light emitting element layer according to still another embodiment. FIG. 20 is a schematic cross-sectional view illustrating an example of a first emission area of a first sub-pixel included in the display device of FIG. 19.

Referring to FIGS. 19 and 20, the second insulating layer 520_1 of the light emitting element layer EML_4 disposed in a first sub-pixel PX1_4 of a pixel PX_4 of the display device 10 according to the embodiment includes the base layer 521 and the first lower wavelength conversion particles 522, which is a difference from the embodiment of FIGS. 4 and 6.

The second insulating layer 520_1 disposed in the first sub-pixel PX1_4 of the display device 10 according to the embodiment may include the base layer 521 and the first lower wavelength conversion particles 522, and the second insulating layer 520 disposed in the second sub-pixel PX2 and the third sub-pixel PX3 may not include wavelength conversion particles. The first sub-pixel PX1_4 may include the second insulating layer 520_1 including the base layer 521 and the first lower wavelength conversion particles 522 dispersed in the base layer 521.

As illustrated in FIG. 20, the second insulating layer 520_1, including the base layer 521 and the first lower wavelength conversion particles 522 dispersed in the base layer 521, may be disposed on the first light emitting element ED1 of the first sub-pixel PX1_4.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a first electrode and a second electrode spaced apart from each other;
   first light emitting elements disposed between the first electrode and the second electrode, and emitting first light;
   second light emitting elements disposed between the first electrode and the second electrode, and emitting second light; and
   a wavelength conversion pattern disposed on the first light emitting elements and the second light emitting elements, wherein
   a peak wavelength of the first light is different from a peak wavelength of the second light, and
   the first light emitting elements and the second light emitting elements are disposed on a same layer.

2. The display device of claim 1, wherein
   the wavelength conversion pattern includes a wavelength conversion material that converts the first light into third light, and
   a peak wavelength of the third light is different from the peak wavelength of the first light.

3. The display device of claim 2, wherein
   the peak wavelength of the third light is different from the peak wavelength of the second light, and
   the wavelength conversion material converts the second light into the third light.

4. The display device of claim 2, wherein the peak wavelength of the third light and the peak wavelength of the second light are included in a same range.

5. The display device of claim 1, wherein
   the peak wavelength of the first light is shorter than the peak wavelength of the second light, and
   a number of the first light emitting elements is greater than a number of the second light emitting elements.

6. The display device of claim 5, wherein
   the first light has a peak wavelength in a range of about 445 nm to about 480 nm, and
   the second light has a peak wavelength in a range of about 480 nm to about 780 nm.

7. The display device of claim 1, wherein the first light emitting elements and the second light emitting elements are electrically connected in parallel to each other.

8. A display device comprising:
   a first electrode and a second electrode spaced apart from each other;
   light emitting elements disposed between the first electrode and the second electrode;
   a first insulating layer disposed on the light emitting elements and exposing ends of each of the light emitting elements; and
   a wavelength conversion pattern disposed on the first insulating layer and the light emitting elements, and including a wavelength conversion material, wherein
   the light emitting elements include first light emitting elements, each of the first light emitting element emits first light,
   the first insulating layer includes lower wavelength conversion particles that convert the first light into second light,
   the wavelength conversion material converts the first light into third light, and
   a peak wavelength of the first light is different from a peak wavelength of the second light and a peak wavelength of the third light.

9. The display device of claim 8, wherein
   the peak wavelength of the second light is different from the peak wavelength of the third light, and
   the wavelength conversion material converts the second light into the third light.

10. The display device of claim 8, wherein the peak wavelength of the third light and the peak wavelength of the second light are included in a same range.

11. The display device of claim 8, wherein
    the light emitting elements include second light emitting elements, each of the second light emitting elements emits fourth light,
    a peak wavelength of the fourth light is different from the peak wavelength of the first light, and
    the first light emitting elements and the second light emitting elements are disposed on a same layer.

12. The display device of claim 11, wherein
    the peak wavelength of the fourth light and the peak wavelength of the second light are included in a same range, or
    the peak wavelength of the fourth light and the peak wavelength of the third light are included in a same range.

13. The display device of claim 11, wherein
the peak wavelength of the first light is shorter than the peak wavelength of the fourth light, and
a number of the first light emitting elements is greater than a number of the second light emitting elements.

14. A display device comprising:
sub-pixels;
a first electrode and a second electrode disposed in each of the sub-pixels and spaced apart from each other;
light emitting elements disposed between the first electrode and the second electrode and disposed in each of the sub-pixels; and
a color control layer disposed on the light emitting elements and disposed in each of the sub-pixels, wherein
the sub-pixels include a first sub-pixel that emits light of a first color,
the light emitting elements include a first light emitting element disposed in the first sub-pixel,
the first light emitting element includes:
   a first main light emitting element including at least one first light emitting element that emits light of a second color; and
   a first sub-light emitting element including at least one second light emitting element that emits light of a third color, and
the first main light emitting element and the first sub-light emitting element are disposed on a same layer, and
the second color is different from the third color and the first color.

15. The display device of claim 14, wherein
the light of the second color has a peak wavelength in a range of about 445 nm to about 480 nm, and
the light of the third color has a peak wavelength in a range of about 480 nm to about 780 nm.

16. The display device of claim 15, wherein
the at least one first light emitting element included in the first main light emitting element includes a plurality of first light emitting elements,
the at least one second light emitting element included in the first sub-light emitting element includes a plurality of second light emitting elements, and
a number of the at least one first light emitting element is greater than a number of the at least one second light emitting element.

17. The display device of claim 15, wherein
the first color is different from the third color, and
the color control layer includes a first wavelength conversion pattern disposed in the first sub-pixel and converting the second color light and the third color light into the first color light.

18. The display device of claim 16, wherein
the sub-pixels include a second sub-pixel that emits the third color light,
the light emitting elements include a second light emitting element disposed in the second sub-pixel, and
the second light emitting element includes:
   a second main light emitting element including the at least one first light emitting element, and
   a second sub-light emitting element including the at least one second light emitting element.

19. The display device of claim 15, wherein
the first color and the third color are a same color, and
the color control layer includes a first wavelength conversion pattern disposed in the first sub-pixel and converting the second color light into the first color light.

20. The display device of claim 19, wherein
the sub-pixels include a second sub-pixel that emits light of a fourth color,
the light emitting elements include a second light emitting element disposed in the second sub-pixel, and
the second light emitting element includes:
   a second main light emitting element including the at least one first light emitting element; and
   a second sub-light emitting element including a third light emitting element that emits the light of the fourth color.

* * * * *